(12) United States Patent
Terada et al.

(10) Patent No.: US 8,840,728 B2
(45) Date of Patent: *Sep. 23, 2014

(54) IMPRINT SYSTEM FOR PERFORMING A TREATMENT ON A TEMPLATE

(75) Inventors: Shoichi Terada, Koshi (JP); Yoshio Kimura, Koshi (JP); Takahiro Kitano, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 154 days.

This patent is subject to a terminal disclaimer.

(21) Appl. No.: 13/378,163

(22) PCT Filed: Jun. 21, 2010

(86) PCT No.: PCT/JP2010/060465
§ 371 (c)(1),
(2), (4) Date: Dec. 14, 2011

(87) PCT Pub. No.: WO2010/150742
PCT Pub. Date: Dec. 29, 2010

(65) Prior Publication Data
US 2012/0097336 A1    Apr. 26, 2012

(30) Foreign Application Priority Data

Jun. 24, 2009    (JP) ................................ 2009-149849

(51) Int. Cl.
*C23C 16/00* (2006.01)
*B05C 21/00* (2006.01)
(Continued)

(52) U.S. Cl.
CPC .......... *B29C 33/58* (2013.01); *H01L 21/68707* (2013.01); *B05C 13/00* (2013.01); *H01L 21/566* (2013.01); *H01L 21/67333* (2013.01); *H01L 21/6715* (2013.01); *H01L 21/6719* (2013.01); *G03F 7/0002* (2013.01); *B82Y 10/00* (2013.01); *B82Y 40/00* (2013.01); *H01L 21/67207* (2013.01); *H01L 21/67057* (2013.01); *H01L 21/67178* (2013.01); *Y10S 414/141* (2013.01)

USPC ........... 118/725; 118/719; 118/729; 118/503; 118/73; 427/133; 427/154; 427/314; 156/345.32; 156/389; 264/39; 264/264; 264/309; 414/217; 414/941; 425/90; 396/579; 396/611; 101/483

(58) Field of Classification Search
CPC ...... B82Y 10/00; B82Y 40/00; G03F 7/0002; H01L 21/67276; H01L 21/67742; B05C 9/14; B05C 13/02; B05C 13/00; B05C 9/10
USPC ....................... 118/72, 719; 156/389; 134/61; 264/40.1; 101/483; 216/44; 424/9.1; 438/597; 414/217; 427/9, 424; 355/53; 700/97, 112; 396/611; 34/406
See application file for complete search history.

(56) References Cited

U.S. PATENT DOCUMENTS 5,259,926 A * 11/1993 Kuwabara et al. ............... 216/54
5,314,509 A * 5/1994 Kato et al. ...................... 34/406
(Continued)

FOREIGN PATENT DOCUMENTS

JP    A-2004-351693    12/2004
JP    A-2005-153091    6/2005
(Continued)

OTHER PUBLICATIONS

International Search Report mailed Aug. 24, 2010 in corresponding International Application No. PCT/JP2010/060465.

*Primary Examiner* — Dah-Wei D Yuan
*Assistant Examiner* — Karl Kurple
(74) *Attorney, Agent, or Firm* — Posz Law Group, PLC

(57) ABSTRACT

The present invention is a template treatment apparatus forming a film of a release agent on a template having a transfer pattern formed on a front surface thereof, the template treatment apparatus including: a treatment station forming a film of a release agent on the front surface of the template; and a template carry-in/out station capable of keeping a plurality of the templates, and carrying the template into/out of the treatment station, wherein the treatment station includes: a cleaning unit cleaning the front surface of the template; a coating unit applying a release agent to the cleaned front surface of the template; a heating unit baking the applied release agent; and a carry unit carrying the template to the cleaning unit, the coating unit, and the heating unit.

14 Claims, 16 Drawing Sheets

(51) Int. Cl.
  *B05C 13/02* (2006.01)
  *B05C 13/00* (2006.01)
  *H01L 21/687* (2006.01)
  *H01L 21/56* (2006.01)
  *H01L 21/673* (2006.01)
  *H01L 21/67* (2006.01)
  *G03F 7/00* (2006.01)
  *B82Y 10/00* (2011.01)
  *B82Y 40/00* (2011.01)
  *B29C 33/58* (2006.01)
  *B28B 7/38* (2006.01)
  *B65B 33/00* (2006.01)
  *B05D 3/02* (2006.01)

(56) References Cited

U.S. PATENT DOCUMENTS

| | | | |
|---|---|---|---|
| 5,320,159 A * | 6/1994 | Schneider et al. | 164/268 |
| 5,527,389 A * | 6/1996 | Rosenblum et al. | 118/58 |
| 5,772,905 A * | 6/1998 | Chou | 216/44 |
| 5,788,868 A * | 8/1998 | Itaba et al. | 216/41 |
| 5,934,856 A * | 8/1999 | Asakawa et al. | 414/217 |
| 5,939,130 A * | 8/1999 | Shiraishi et al. | 427/9 |
| 6,068,801 A * | 5/2000 | Bodo et al. | 264/39 |
| 6,245,156 B1 * | 6/2001 | Taniyama et al. | 134/6 |
| 6,266,125 B1 * | 7/2001 | Fukuda et al. | 355/27 |
| 6,287,023 B1 * | 9/2001 | Yaegashi et al. | 396/565 |
| 6,334,960 B1 * | 1/2002 | Willson et al. | 216/52 |
| 6,372,160 B1 * | 4/2002 | Kendall | 264/39 |
| 6,431,769 B1 * | 8/2002 | Fukuda et al. | 396/611 |
| 6,464,789 B1 * | 10/2002 | Akimoto | 118/666 |
| 6,530,993 B2 * | 3/2003 | Hwang et al. | 118/719 |
| 6,805,054 B1 * | 10/2004 | Meissl et al. | 101/483 |
| 6,832,863 B2 * | 12/2004 | Sugimoto et al. | 396/611 |
| 6,852,194 B2 * | 2/2005 | Matsushita et al. | 156/345.32 |
| 6,926,057 B2 * | 8/2005 | Ueyama et al. | 156/540 |
| 6,946,026 B2 * | 9/2005 | Sato et al. | 106/38.22 |
| 6,972,844 B2 * | 12/2005 | Tokita | 356/401 |
| 7,210,246 B2 * | 5/2007 | van der Meulen | 34/467 |
| 7,270,510 B2 * | 9/2007 | Putzi | 414/226.05 |
| 7,798,764 B2 * | 9/2010 | Rice et al. | 414/805 |
| 7,832,416 B2 * | 11/2010 | Wang et al. | 134/61 |
| 8,016,537 B2 * | 9/2011 | Watanabe et al. | 414/217 |
| 8,025,831 B2 * | 9/2011 | Kong et al. | 264/297.4 |
| 8,207,069 B2 * | 6/2012 | Weiner et al. | 438/800 |
| 8,227,267 B2 * | 7/2012 | Yoneda et al. | 438/16 |
| 8,268,218 B2 * | 9/2012 | Okuya et al. | 264/272.17 |
| 8,414,703 B2 * | 4/2013 | Weiner et al. | 118/719 |
| 8,468,943 B2 * | 6/2013 | Hiroshiro et al. | 101/483 |
| 8,470,188 B2 * | 6/2013 | Menezes | 216/39 |
| 8,477,301 B2 * | 7/2013 | Kashiyama et al. | 356/237.1 |
| 8,480,946 B2 * | 7/2013 | Mikami et al. | 264/496 |
| 8,501,058 B2 * | 8/2013 | Ito | 264/39 |
| 8,603,380 B2 * | 12/2013 | Ishii et al. | 264/293 |
| 2004/0020601 A1 * | 2/2004 | Zhao et al. | 156/345.32 |
| 2004/0065976 A1 * | 4/2004 | Sreenivasan et al. | 264/171.1 |
| 2004/0083925 A1 * | 5/2004 | Sato | 106/38.22 |
| 2005/0116370 A1 * | 6/2005 | Ogino et al. | 264/40.1 |
| 2006/0072085 A1 * | 4/2006 | Compen et al. | 355/30 |
| 2006/0157444 A1 * | 7/2006 | Nakamura et al. | 216/54 |
| 2006/0292845 A1 * | 12/2006 | Chiang et al. | 438/597 |
| 2006/0292846 A1 * | 12/2006 | Pinto et al. | 438/597 |
| 2007/0062450 A1 * | 3/2007 | Hattori et al. | 118/719 |
| 2007/0093079 A1 * | 4/2007 | Aruga et al. | 438/800 |
| 2007/0134362 A1 * | 6/2007 | Heidari | 425/385 |
| 2007/0138699 A1 | 6/2007 | Wuister et al. | |
| 2007/0248892 A1 * | 10/2007 | Rangelow | 430/5 |
| 2007/0267764 A1 * | 11/2007 | Morimoto | 264/1.1 |
| 2008/0145773 A1 * | 6/2008 | Wang et al. | 430/22 |
| 2009/0039550 A1 | 2/2009 | Suehira et al. | |
| 2009/0261514 A1 * | 10/2009 | Uchida | 264/446 |
| 2009/0311434 A1 * | 12/2009 | Inamasu et al. | 427/424 |
| 2010/0009137 A1 * | 1/2010 | Kodama | 428/195.1 |
| 2010/0053578 A1 * | 3/2010 | Sreenivasan et al. | 355/53 |
| 2010/0078854 A1 * | 4/2010 | Berggren et al. | 264/293 |
| 2010/0085555 A1 * | 4/2010 | Schmid et al. | 355/76 |
| 2010/0089096 A1 | 4/2010 | Tamitsuji et al. | |
| 2010/0096772 A1 * | 4/2010 | Okuya et al. | 264/272.17 |
| 2010/0131093 A1 * | 5/2010 | Yokoyama et al. | 700/112 |
| 2010/0143521 A1 * | 6/2010 | Choi et al. | 425/150 |
| 2010/0168889 A1 * | 7/2010 | Sekido et al. | 700/97 |
| 2011/0000512 A1 * | 1/2011 | Toshima et al. | 134/34 |
| 2011/0117291 A1 * | 5/2011 | Hiroshiro et al. | 427/553 |
| 2011/0127156 A1 * | 6/2011 | Foad et al. | 204/192.12 |
| 2011/0163451 A1 * | 7/2011 | Matsumoto et al. | 257/751 |
| 2011/0219635 A1 * | 9/2011 | Rangelow | 33/645 |
| 2011/0319516 A1 * | 12/2011 | Xu et al. | 522/79 |
| 2012/0073461 A1 * | 3/2012 | Terada et al. | 101/425 |
| 2012/0086142 A1 * | 4/2012 | Terada et al. | 264/39 |
| 2012/0223048 A1 * | 9/2012 | Paranjpe et al. | 216/22 |
| 2012/0299147 A1 * | 11/2012 | Mitani | 257/506 |
| 2012/0308678 A1 * | 12/2012 | Hayashi et al. | 425/90 |
| 2013/0119364 A1 * | 5/2013 | Yamazaki et al. | 257/40 |
| 2013/0302115 A1 * | 11/2013 | Wakabayashi et al. | 414/217 |

FOREIGN PATENT DOCUMENTS

| | | |
|---|---|---|
| JP | A-2007-173806 | 7/2007 |
| JP | A-2009-43998 | 2/2009 |
| JP | A-2009-45925 | 3/2009 |

* cited by examiner

→ Y (a)

(b)

(c)

IMPRINT SYSTEM FOR PERFORMING A TREATMENT ON A TEMPLATE

TECHNICAL FIELD

The present invention relates to a template treatment apparatus forming a film of a release agent on a template having a transfer pattern formed on a front surface thereof, and an imprint system including the template treatment apparatus.

BACKGROUND ART

In a manufacturing process of a semiconductor device, for example, photolithography processing is performed, for example, on a semiconductor wafer (hereinafter, referred to as a "wafer") to form a predetermined resist pattern on the wafer.

When forming the above-described resist pattern, miniaturization of the resist pattern is required in order for higher integration of the semiconductor device. Generally, the limit of miniaturization in the photolithography processing is about the wavelength of light used in exposure processing. Therefore, conventionally, the wavelength of light for use in the exposure processing has been increasingly reduced. However, there are technical and cost limits in reducing the wavelength of an exposure light source, and it is now difficult to form a fine resist pattern at a level of, for example, several nanometers only by the method of increasingly reducing the wavelength of light.

Hence, it is recently proposed to form a fine resist pattern on the wafer using a so-called imprint method instead of performing photolithography processing on the wafer. This method is to bring a template (referred also to as a mold or a die) having a fine pattern on its front surface into press contact with the resist surface formed on the wafer and then peel off the template to thereby directly transfer the pattern to the resist surface (Patent Document 1).

PRIOR ART DOCUMENT

Patent Document

[Patent Document 1] Japanese Laid-open Patent Publication No. 2009-43998

DISCLOSURE OF THE INVENTION

Problems to be Solved by the Invention

Incidentally, when the above-described imprint method is repeatedly performed, namely, when resist patterns are formed on a plurality of wafers using one template, the transfer of pattern cannot be correctly performed any longer from a certain point in time. This is caused by deterioration of a release agent, having liquid repellency to a resist, whose film is typically formed on the front surface of the template. Therefore, it is necessary to periodically replace the template.

Further, when different resist patterns are formed on a plurality of wafers, the template needs to be replaced for each resist pattern.

In order to form the resist patterns on the plurality of wafers as described above, a plurality of replacement templates are required. In other words, it is necessary to form the release agent on front surfaces of the plurality of templates in advance.

However, efficient film formation of the release agent is not considered at all in the conventional imprint method. The film formation of the release agent is usually performed, for example, by hand for each template. Therefore, it takes time to form a film on the template and it is impossible sometimes to replace the template at a required timing. Further, there is a case that the film of the release agent cannot be accurately formed such as the case that the release agent on the template becomes uneven. Accordingly, it is actually difficult to successively form predetermined resist patterns on a plurality of wafers, thus failing to cope with mass production of semiconductor devices.

The present invention is made in consideration of the above points, and it is an object to successively form films of a release agent on a plurality of templates.

Means for Solving the Problems

To achieve the above object, the present invention is a template treatment apparatus forming a film of a release agent on a template having a transfer pattern formed on a front surface thereof, the template treatment apparatus including: a treatment station performing a predetermined treatment on the template to form a film of a release agent on the front surface of the template; and a template carry-in/out station capable of keeping a plurality of the templates, and carrying the template into/out of the treatment station, wherein the treatment station includes: a cleaning unit cleaning the front surface of the template; a coating unit applying a release agent to the cleaned front surface of the template; a heating unit baking the applied release agent; and a carry unit carrying the template to the cleaning unit, the coating unit, and the heating unit.

According to the present invention, since the template carry-in/out station is capable of keeping a plurality of templates, the templates can be successively carried from the template carry-in/out station to the treatment station. Further, since the carry unit can carry the template to various treatment units such as the cleaning unit, the coating unit, and the heating unit in the treatment station, predetermined treatments can be successively performed on a plurality of templates. Therefore, films of the release agent can be successively formed on the plurality of templates.

The present invention according to another aspect is an imprint system including the template treatment apparatus, the imprint system including: an imprint unit transferring the transfer pattern to a coating film formed on a substrate using the template having the film of the release agent formed on the front surface thereof in the treatment station, to form a predetermined pattern in the coating film; and a substrate carry-in/out station capable of keeping a plurality of the substrates, and carrying the substrate into/out of the imprint unit.

Effect of the Invention

According to the present invention, it is possible to successively form films of a release agent on a plurality of templates.

BEST MODE FOR CARRYING OUT THE INVENTION

Figure 1:
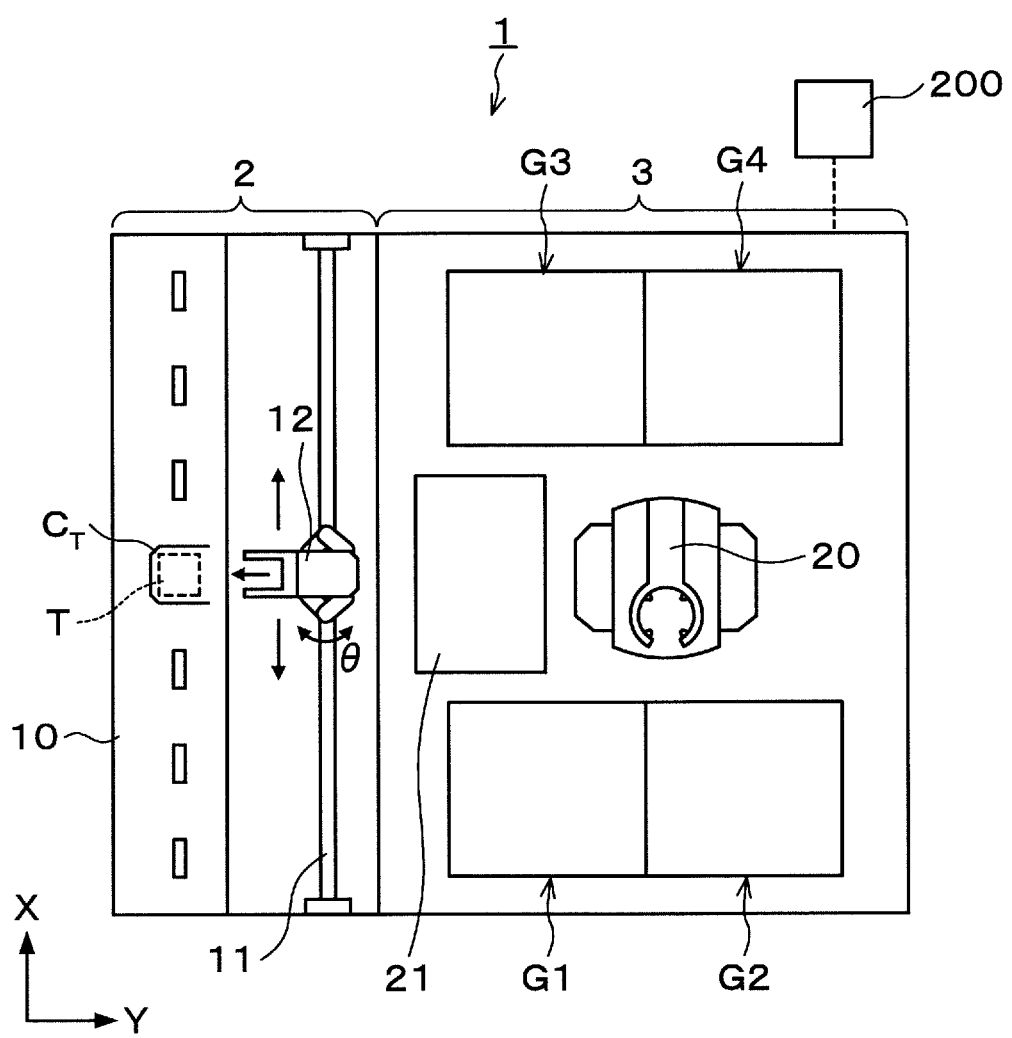
FIG. 1 A plan view illustrating the outline of the configuration of a template treatment apparatus according to this embodiment.
Figure 2:
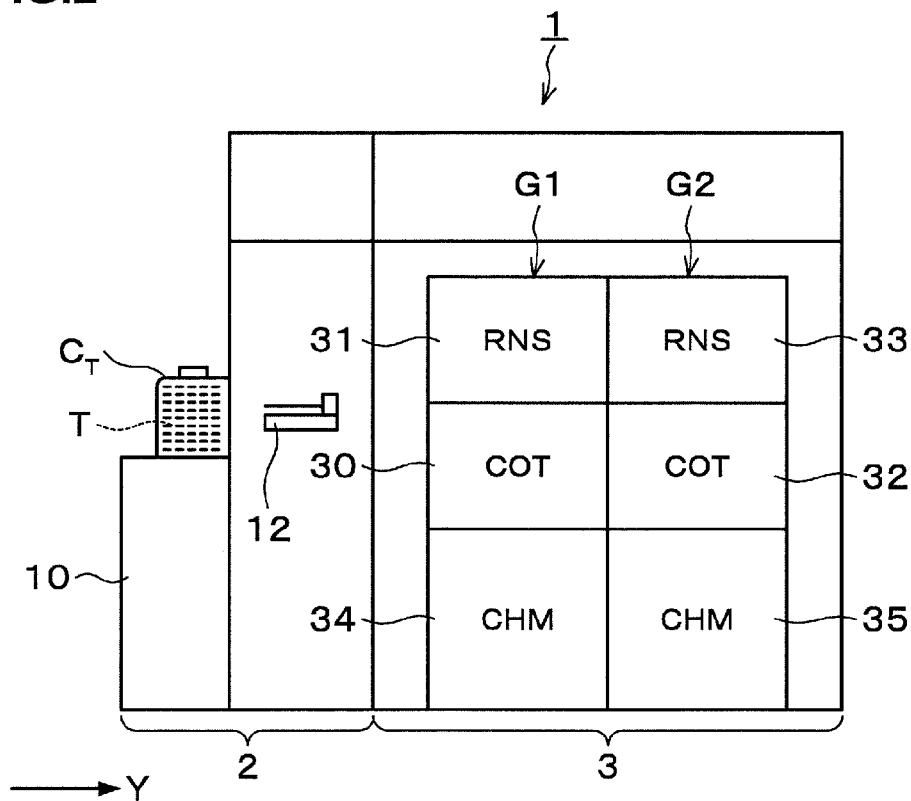
FIG. 2 A side view illustrating the outline of the configuration of the template treatment apparatus according to this embodiment.
Figure 3:
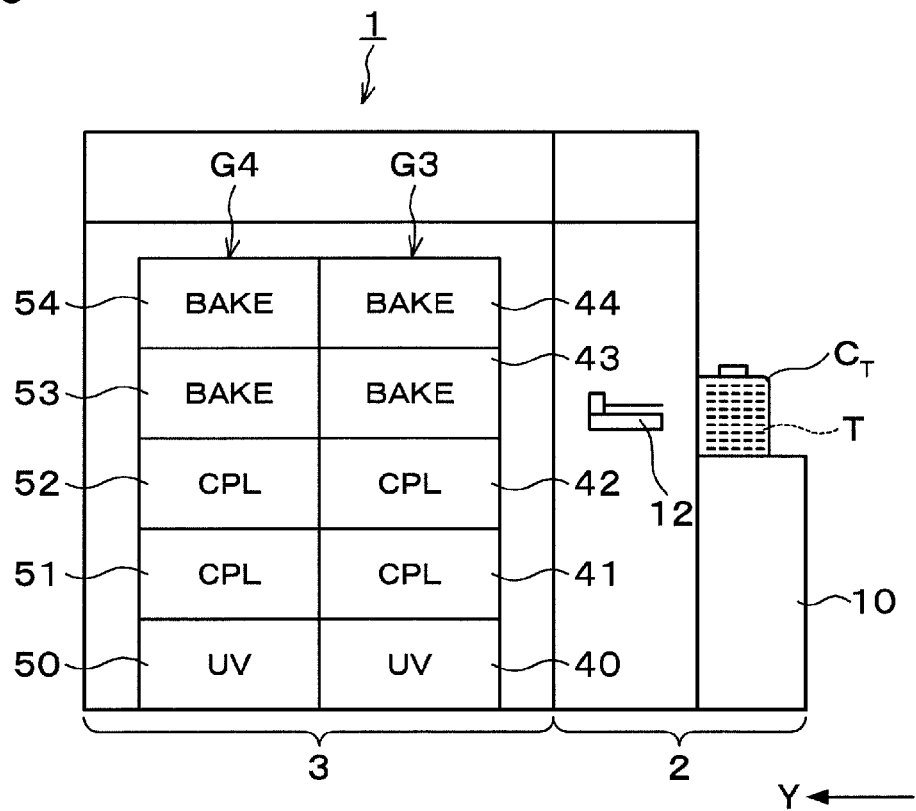
FIG. 3 A side view illustrating the outline of the configuration of the template treatment apparatus according to this embodiment.

Hereinafter, an embodiment of the present invention will be described. FIG. 1 is a plan view illustrating the outline of the configuration of a template treatment apparatus 1 according to this embodiment. FIG. 2 and FIG. 3 are side views illustrating the outline of the configuration of the template treatment apparatus 1.

Figure 4:
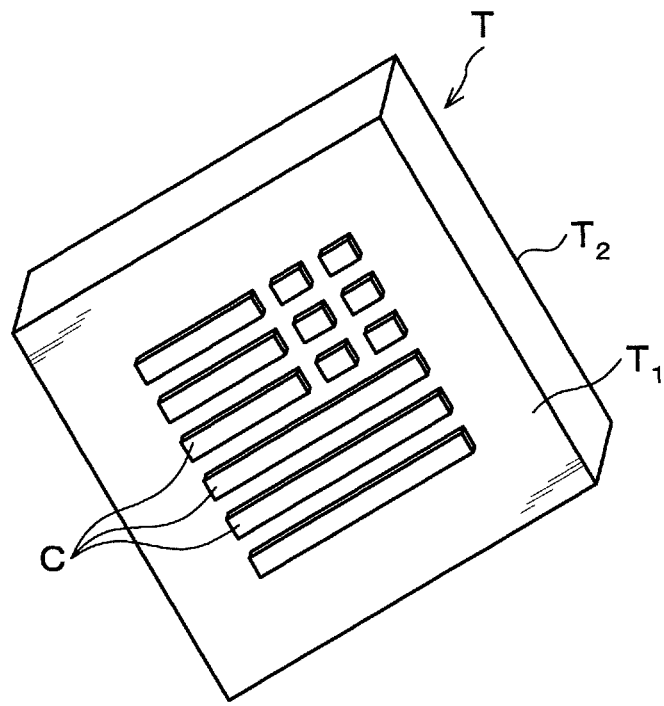
FIG. 4 A perspective view of a template.

In the template treatment apparatus 1 of this embodiment, a template T which has a rectangular parallelepiped shape and a predetermined transfer pattern C formed on its front surface as illustrated in FIG. 4 is used. Hereinafter, the surface of the template T on which the transfer pattern C is formed is referred to as a front surface $T_1$ and the surface opposite the front surface $T_1$ is referred to as a rear surface $T_2$. Note that for the template T, a transparent material which can transmit light such as visible light, near ultraviolet light, ultraviolet light, for example, glass is used.

The template treatment apparatus 1 has, as illustrated in FIG. 1, the configuration in which a template carry-in/out station 2 for carrying a plurality of, for example, 5 templates T per cassette as a unit from/to the outside into/from the template treatment apparatus 1 and carrying the templates T into/out of a template cassette $C_T$, and a treatment station 3 including a plurality of treatment units performing predetermined treatments on the template T are integrally connected.

In the template carry-in/out station 2, a cassette mounting table 10 is provided. The cassette mounting table 10 is configured such that a plurality of template cassettes $C_T$ can be mounted thereon in a line in an X-direction (a top and bottom direction in FIG. 1). In other words, the template carry-in/out station 2 is configured to be capable of keeping a plurality of templates T therein.

In the template carry-in/out station 2, a template carrying body 12 is provided which is movable on a carry path 11 extending in the X-direction. The template carrying body 12 is also movable in a vertical direction and around the vertical (in a θ-direction), and thus can carry the template T between the template cassette $C_T$ and the treatment station 3.

At a central portion in the treatment station 3, a carry unit 20 is provided. Around the carry unit 20, for example, four treatment blocks G1 to G4 are arranged in each of which a plurality of treatment units are multi-tiered. On the front side (an X-direction negative direction side in FIG. 1) in the treatment station 3, the first treatment block G1 and the second treatment block G2 are placed in order from the template carry-in/out station 2 side. On the rear side (an X-direction positive direction side in FIG. 1) in the treatment station 3, the third treatment block G3 and the fourth treatment block G4 are placed in order from the template carry-in/out station 2 side. A transition unit 21 for passing the template T is placed on the template carry-in/out station 2 side in the treatment station 3. The carry unit 20 can carry the template T to the later-described various kinds of treatment units arranged in the treatment blocks G1 to G4 and the transition unit 21.

In the first treatment block G1, as illustrated in FIG. 2, a plurality of solution treatment units, for example, a coating unit 30 applying a liquid release agent to the template T and a rinse unit 31 rinsing the release agent on the template T away are two-tiered in order from the bottom. In the second treatment block G2, a coating unit 32 and a rinse unit 33 are similarly two-tiered in order from the bottom. Further, chemical chambers 34, 35 each for supplying various treatment solutions to the solution treatment units are provided on the lowermost tiers of the first treatment block G1 and the second treatment block G2, respectively.

In the third treatment block G3, as illustrated in FIG. 3, a cleaning unit 40 irradiating the template T with ultraviolet light to clean the front surface $T_1$ before a film of the release agent is formed on the template T, temperature regulation units 41, 42 each regulating the temperature of the template T, and heating units 43, 44 each performing heat treatment on the template T are five-tiered in order from the bottom.

Also in the fourth treatment block G4, a cleaning unit 50, temperature regulation units 51, 52, and heating units 53, 54 are five-tiered in order from the bottom as in the third treatment block G3.

Next, the configuration of the aforementioned carry unit 20 will be described. The carry unit 20 has a plurality of, for example, two carrying arms 100 holding and carrying the templates T as illustrated in FIG. 5.

Figure 6:
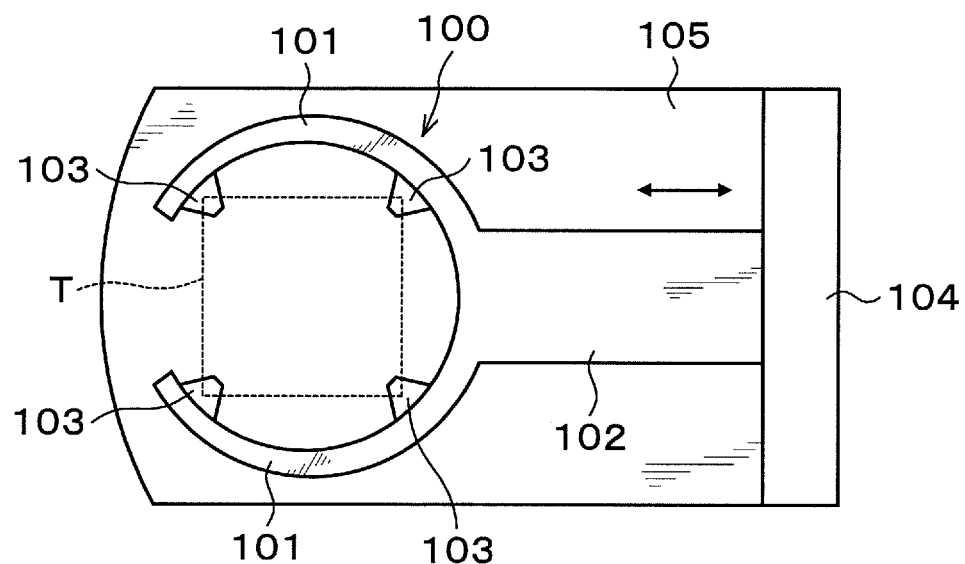
FIG. 6 A plan view illustrating the outline of the configuration of the carry unit.

The carrying arm 100 has an arm part 101 configured in an almost ¾ circular ring shape larger in radius than the template T and a support part 102 integrally formed with the arm part 101 and supporting the arm part 101 as illustrated in FIG. 6. The arm part 101 is provided with holding parts 103 projecting inward and holding the corner portions of the template T, for example, at four locations. The carrying arm 100 can horizontally hold the template T on the holding parts 103.

Figure 5:
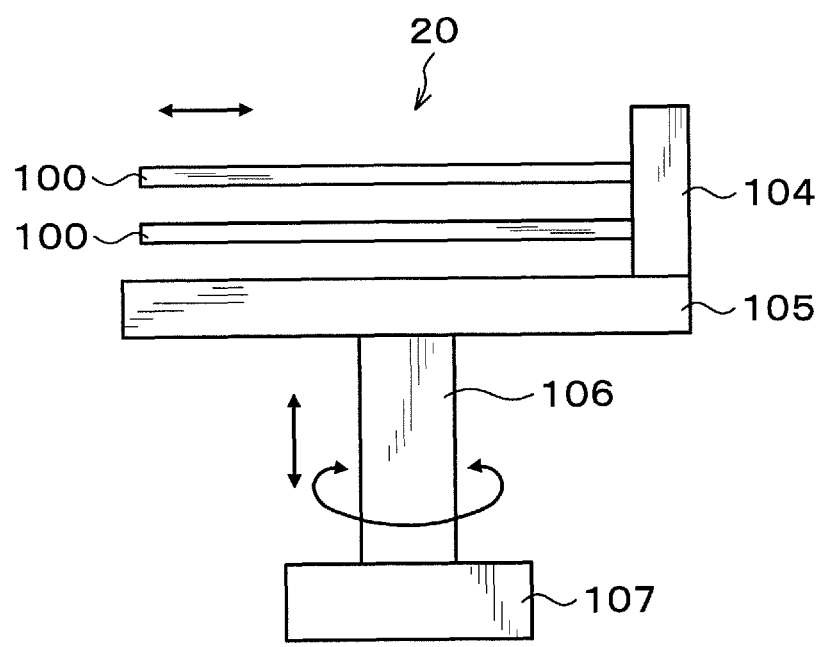
FIG. 5 A side view illustrating the outline of the configuration of a carry unit.

At the base end portion of the carrying arm 100, an arm drive part 104 is provided as illustrated in FIG. 5. By means of the arm drive part 104, each of the carrying arms 100 can independently move in the horizontal direction. The carrying arms 100 and the arm drive part 104 are supported on a base 105. At the lower surface of the base 105, a rotation drive part 107 is provided via a shaft 106. By means of the rotation drive part 107, the base 105 and the carrying arms 100 can rotate around the shaft 106 and move up and down.

Next, the configurations of the aforementioned coating units 30, 32 will be described. The coating unit 30 has a casing 110 having a carry-in/out port (not illustrated) for the template T formed in its side surface as illustrated in FIG. 7.

Figure 8:
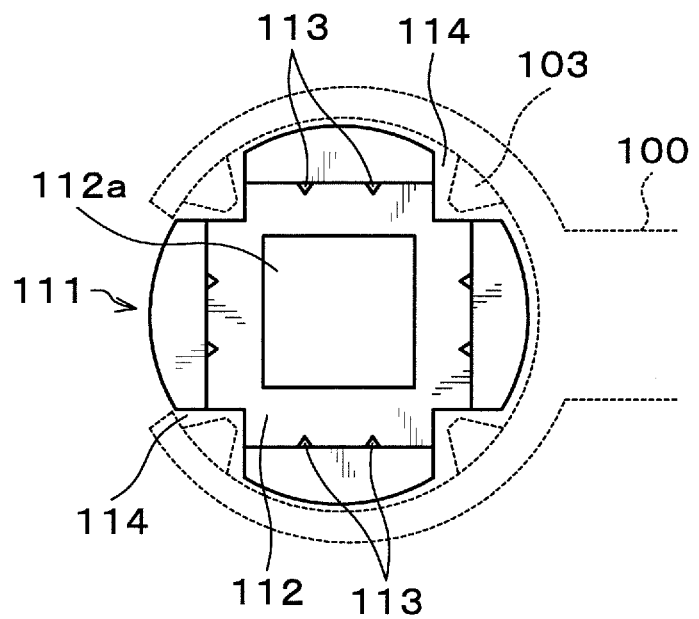
FIG. 8 A plan view illustrating the outline of the configuration of a holding member.

At a central portion in the casing 110, a holding member 111 holding and rotating the template T is provided. A central portion of the holding member 111 is recessed downward to form an accommodating part 112 accommodating the template T. At the lower portion of the accommodating part 112, a groove part 112a that is smaller than the outer shape of the template T is formed. Accordingly, in the accommodating part 112, the inner peripheral portion of the lower surface of the template T is not in contact with the holding member 111 due to the groove part 112a, but only the outer peripheral portion of the lower surface of the template T is supported by the holding member 111. The accommodating part 112 has an almost quadrilateral planar shape conforming to the outer shape of the template T as illustrated in FIG. 8. In the accommodating part 112, a plurality of projecting parts 113 projecting inward from the side surfaces are formed so that the projecting parts 113 position the template T which is accommodated in the accommodating part 112. Further, to prevent the holding parts 103 of the carrying arm 100 from interfering with the accommodating part 112 when the template T is passed from the carrying arm 100 to the accommodating part 112, cutout parts 114 are formed at four locations at the outer periphery of the accommodating part 112.

Figure 7:
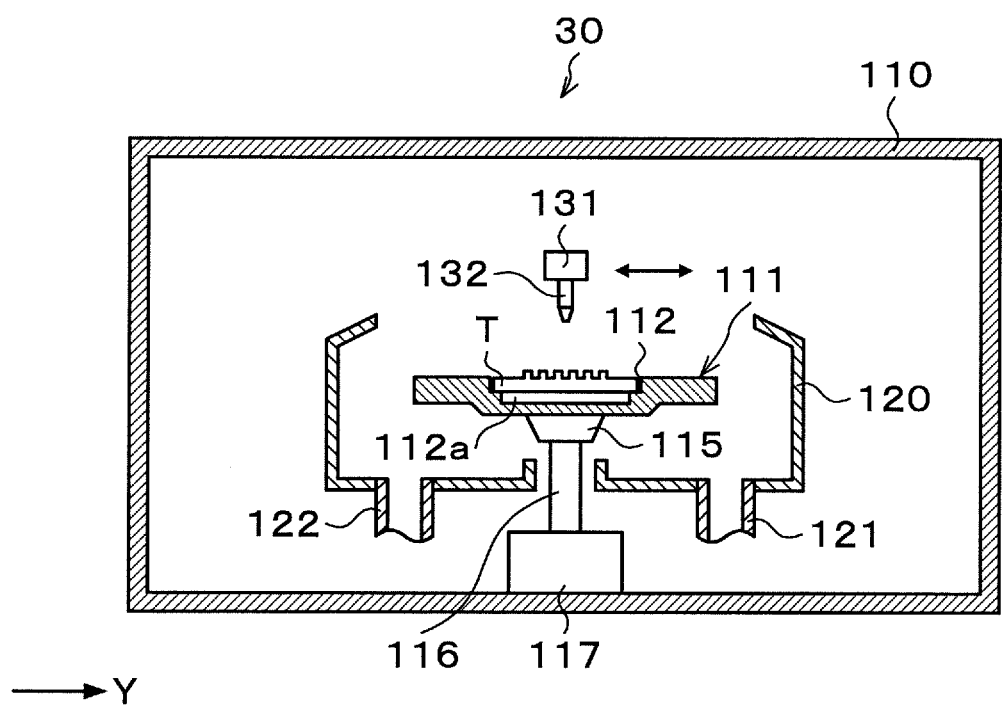
FIG. 7 A longitudinal sectional view illustrating the outline of the configuration of a coating unit.

The holding member 111 is attached to a cover body 115 as illustrated in FIG. 7, and a rotation drive part 117 is provided below the holding member 111 via a shaft 116. By means of the rotation drive part 117, the holding member 111 can rotate at a predetermined speed around the vertical and move up and down.

Around the holding member 111, a cup 120 is provided which receives and recovers the release agent splashing or dropping from the template T. A drain pipe 121 draining the recovered release agent and an exhaust pipe 122 exhausting the atmosphere in the cup 120 are connected to the bottom surface of the cup 120.

Figure 9:
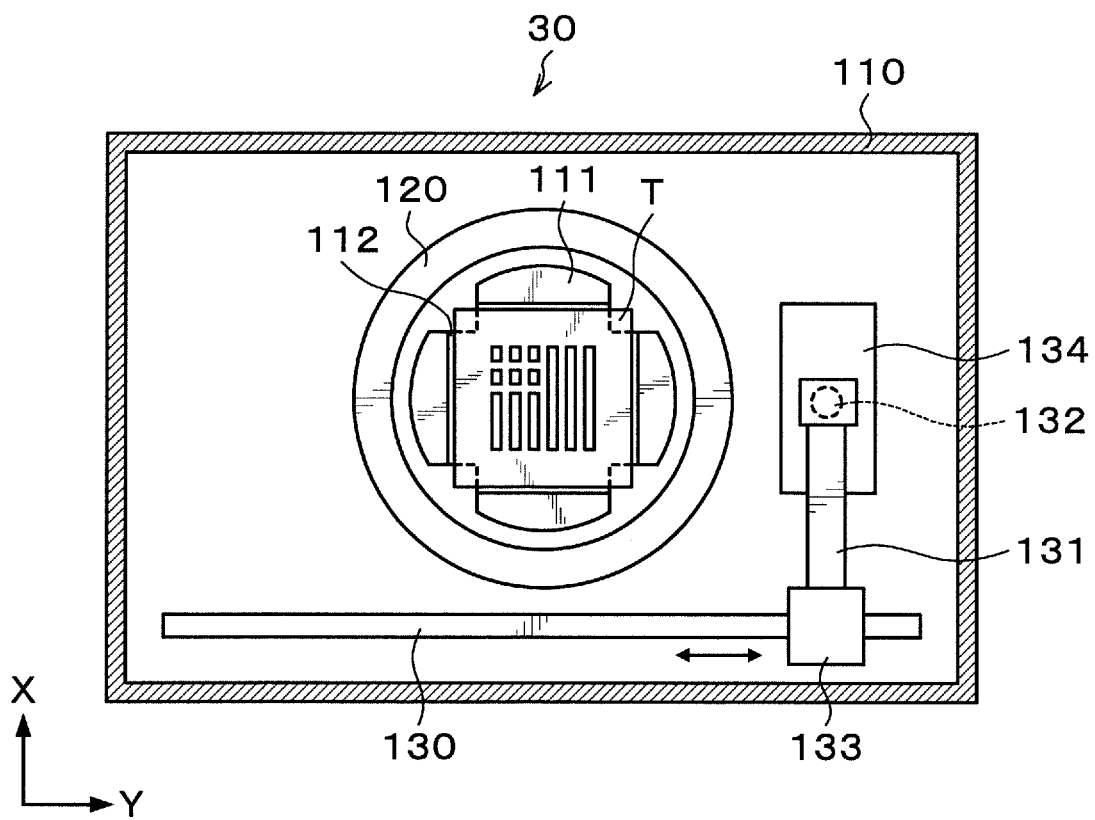
FIG. 9 A transverse sectional view illustrating the outline of the configuration of the coating unit.

As illustrated in FIG. 9, on an X-direction negative direction (a downward direction in FIG. 9) side of the cup 120, a rail 130 extending along a Y-direction (a right and left direction in FIG. 9) is formed. The rail 130 is formed, for example, from a Y-direction negative direction (a left direction in FIG. 9) side outer position of the cup 120 to a Y-direction positive direction (a right direction in FIG. 9) side outer position. On the rail 130, for example, an arm 131 is attached.

On the arm 131, a release agent nozzle 132 as a release agent supply part supplying the release agent onto the template T is supported. The arm 131 is movable on the rail 130 by means of a nozzle drive part 133. Thus, the release agent nozzle 132 can move from a waiting section 134 provided at a Y-direction positive direction side outer position of the cup 120 to a position above a central portion of the template T in the cup 120. Further, the arm 131 can freely move up and down by means of the nozzle drive part 133 to be able to adjust the height of the release agent nozzle 132. Note that as the material of the release agent, a material having liquid repellency to a later-described resist film on a wafer, for example, a fluorocarbon resin or the like is used.

Note that a cleaning solution nozzle jetting a cleaning solution, for example, an organic solvent may be provided inside the groove part 112a of the holding member 111. By jetting the cleaning solution from the cleaning solution nozzle to the rear surface $T_2$ of the template T, the rear surface $T_2$ can be cleaned.

Note that the configuration of the coating unit 32 is the same as that of the above-described coating unit 30, and therefore the description thereof will be omitted.

Figure 10:
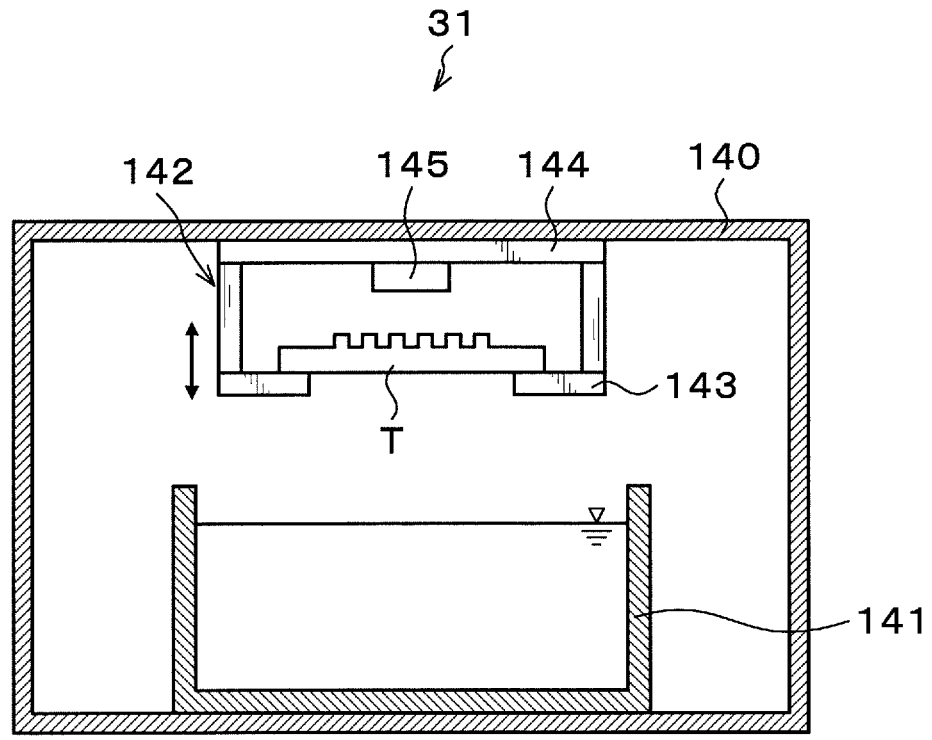
FIG. 10 A longitudinal sectional view illustrating the outline of the configuration of a rinse unit.

Next, the configurations of the aforementioned rinse units 31, 33 will be described. The rinse unit 31 has a casing 140 having a carry-in/out port (not illustrated) for the template T formed in its side surface as illustrated in FIG. 10.

On the bottom surface in the casing 140, an immersion bath 141 for immersing the template T is provided. In the immersion bath 141, the organic solvent for rinsing the release agent on the template T away is stored.

On the ceiling surface in the casing 140 and above the immersion bath 141, a holding part 142 holding the template T is provided. The holding part 142 has a chuck 143 suction-holding the outer peripheral portion of the rear surface $T_2$ of the template T. The template T is held by the chuck 143 such that its front surface $T_1$ faces upward. The chuck 143 can move up and down by means of a raising and lowering mechanism 144. Then, the template T held by the holding part 142 is immersed in the organic solvent stored in the immersion bath 141 and the release agent on the template T is rinsed away.

The holding part 142 has a gas supply part 145 provided above the template T held by the chuck 143. The gas supply part 145 can spray, for example, gaseous gas such an inert gas of nitrogen or dry air downward, namely, to the front surface $T_1$ of the template T held by the chuck 143. Thereby, the front surface $T_1$ of the template T rinsed in the immersion bath 141 can be dried. Note that an exhaust pipe (not illustrated) exhausting the atmosphere in the rinse unit 31 is connected to the rinse unit 31.

Note that the configuration of the rinse unit 33 is the same as that of the above-described rinse unit 31, and therefore the description thereof will be omitted.

Figure 11:
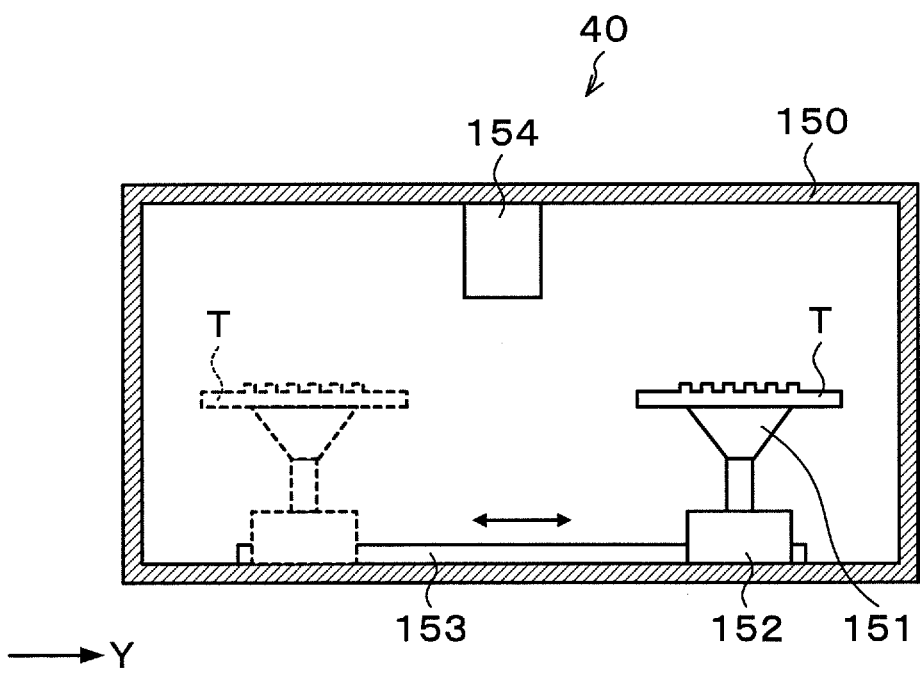
FIG. 11 A longitudinal sectional view illustrating the outline of the configuration of a cleaning unit.

Next, the configurations of the aforementioned cleaning units 40, 50 will be described. The cleaning unit 40 has a casing 150 having a carry-in/out port (not illustrated) for the template T formed in its side surface as illustrated in FIG. 11.

In the casing 150, a chuck 151 suction-holding the template T is provided. The chuck 151 suction-holds the rear surface $T_2$ of the template T such that the front surface $T_1$ of the template T faces upward. Below the chuck 151, a chuck drive part 152 is provided. The chuck drive part 152 is attached on a rail 153 provided at the bottom surface in the casing 150 and extending along a Y-direction. By means of the chuck drive part 152, the chuck 151 can move along the rail 153.

Figure 12:
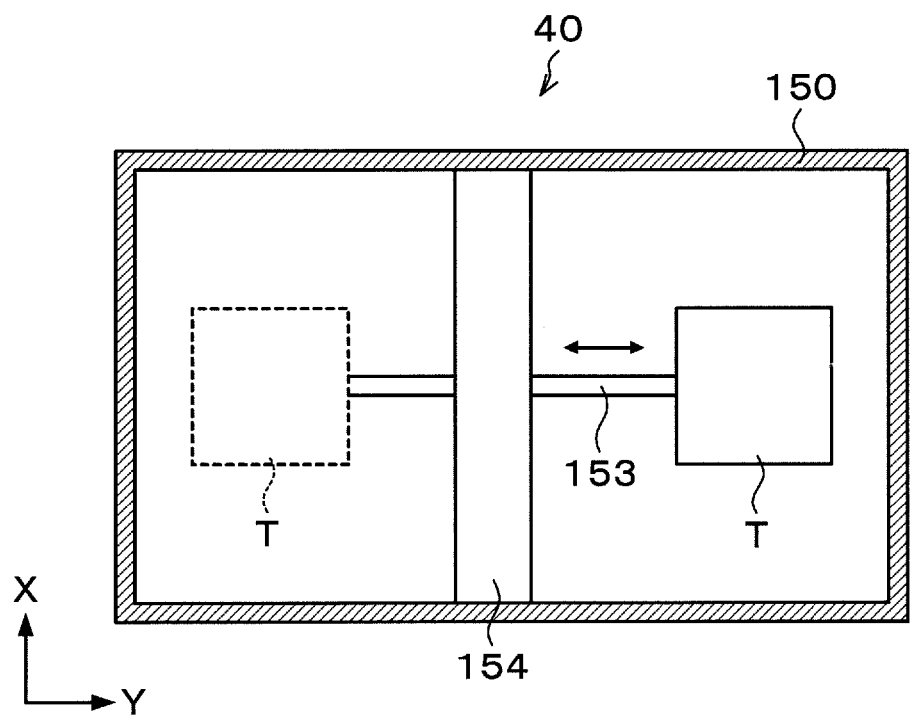
FIG. 12 A transverse sectional view illustrating the outline of the configuration of the cleaning unit.

On the ceiling surface in the casing 150 and above the rail 153, an ultraviolet irradiation part 154 is provided which irradiates the template T held by the chuck 151 with ultraviolet light. The ultraviolet irradiation part 154 extends in an X-direction as illustrated in FIG. 12. The ultraviolet irradiation part 154 irradiates the front surface $T_1$ of the template T with ultraviolet light while the template T is moving along the rail 153, whereby the entire front surface $T_1$ of the template T is irradiated with the ultraviolet light.

Note that the configuration of the cleaning unit 50 is the same as that of the above-described cleaning unit 40, and therefore the description thereof will be omitted.

Figure 13:
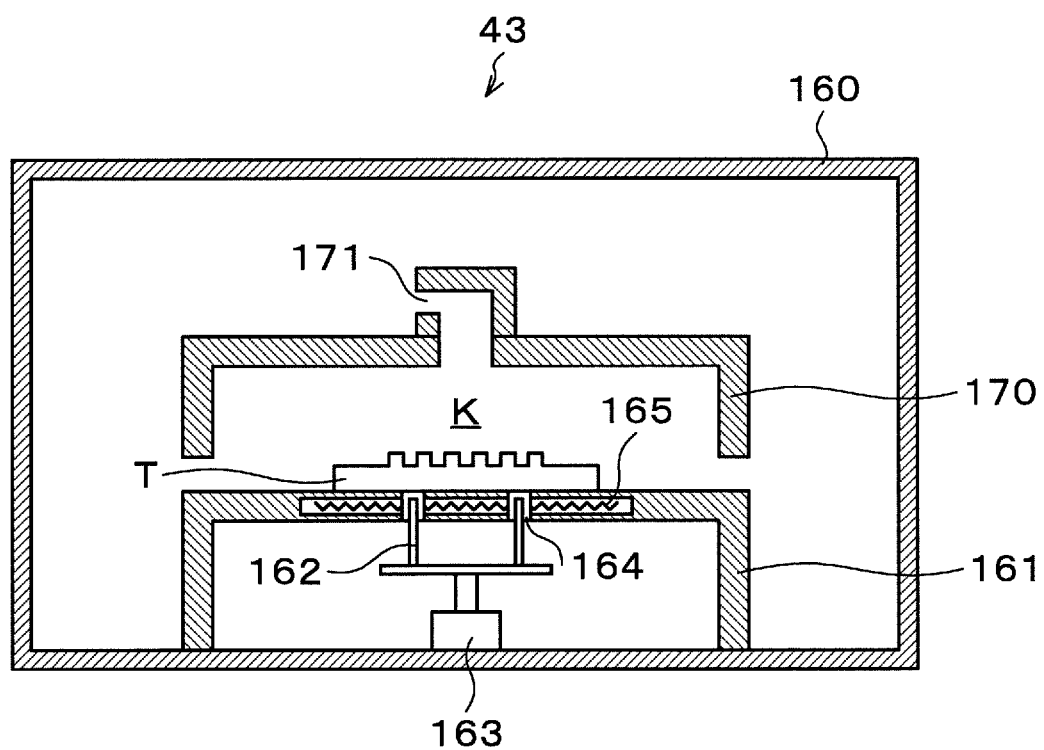
FIG. 13 A longitudinal sectional view illustrating the outline of the configuration of a heating unit.

Next, the configurations of the aforementioned heating units 43, 44, 53, 54 will be described. The heating unit 43 has a casing 160 having a carry-in/out port (not illustrated) for the template T formed in its side surface as illustrated in FIG. 13.

On the bottom surface in the casing 160, a mounting table 161 on which the template T is mounted is provided. The template T is mounted on the upper surface of the mounting table 161 such that its front surface $T_1$ faces upward. Inside the mounting table 161, raising and lowering pins 162 for supporting the template T from below and raising and lowering the template T are provided. The raising and lowering pins 162 can move up and down by means of a raising and lowering drive part 163. In the upper surface of the mounting table 161, through holes 164 penetrating the upper surface in the thickness direction are formed so that the raising and lowering pins 162 are inserted into the through holes 164. Further, a heating plate 165 heating the template T is provided in the upper surface of the mounting table 161. Inside the heating plate 165, a heater generating heat, for example, by power feeding is provided to be able to regulate the heating plate 165 to a predetermined set temperature. Note that the heating plate 165 may be provided above the template T, for example, on the ceiling surface of a later-described lid body 170. Further, heating plates 165 may be provided above and below the template T.

Above the mounting table 161, the lid body 170 movable up and down is provided. The lid body 170 is open at its lower surface and forms a treatment chamber K together with the mounting table 161. At the middle portion of the upper surface of the lid body 170, an exhaust part 171 is provided. The atmosphere in the treatment chamber K is uniformly exhausted from the exhaust part 171.

Note that the configurations of the heating units 44, 53, 54 are the same as that of the above-described heating unit 43, and therefore the description thereof will be omitted.

Further, the configurations of the temperature regulation units 41, 42, 51, 52 are similar to that of the above-described heating unit 43, in which a temperature regulating plate is used in place of the heating plate 165. A cooling member such as, for example, a Peltier element is provided in the temperature regulating plate and can regulate the temperature regulating plate to a set temperature. Further, in this case, the lid body 170 in the heating unit 43 may be omitted.

In the above template treatment apparatus 1, a control unit 200 is provided as illustrated in FIG. 1. The control unit 200 is, for example, a computer and has a program storage unit (not illustrated). In the program storage unit, a program is stored which controls the carry of the template T between the template carry-in/out station 2 and the treatment station 3, the operation of the drive system in the treatment station 3 and so on to thereby execute a later-described release agent treatment in the template treatment apparatus 1. Note that this program may be the one that is stored, for example, in a computer-readable storage medium such as a computer-readable hard disk (HD), flexible disk (FD), compact disk (CD), magneto-optical disk (MO), or memory card, and installed from the storage medium into the control unit 200.

Figure 14:
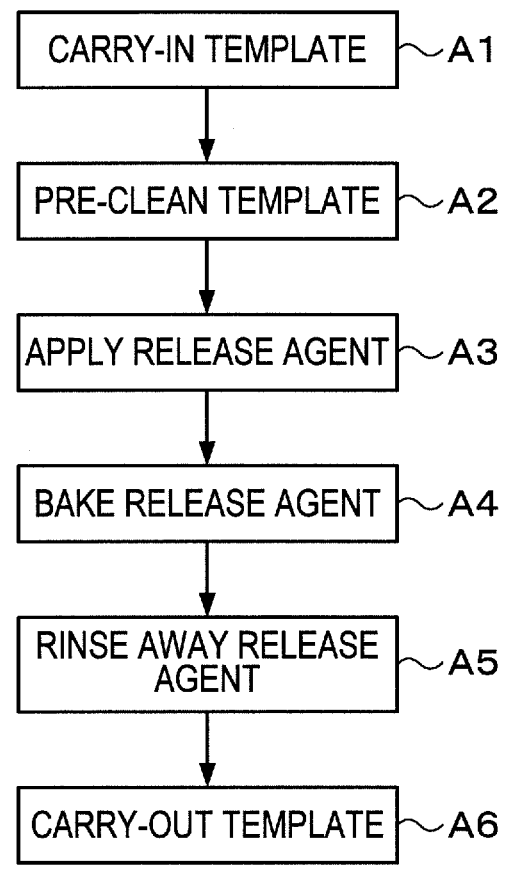
FIG. 14 A flowchart illustrating steps of release agent treatment.
Figure 15:
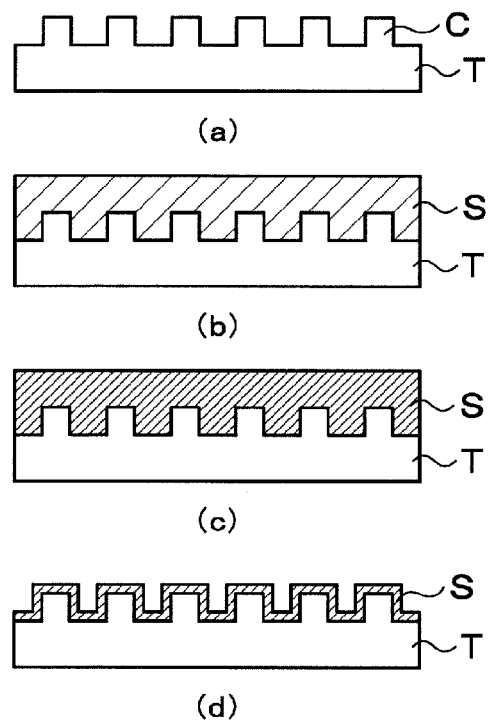
FIG. 15 An explanatory view schematically illustrating the states of a template in respective steps of the release agent treatment, FIG. 15(a) illustrating the appearance that the front surface of the template is cleaned, FIG. 15(b) illustrating the appearance that a release agent is applied on the front surface of the template, FIG. 15(c) illustrating the appearance that the release agent on the template is baked, and FIG. 15(d) illustrating the appearance that a film of the release agent is formed on the template.

The template treatment apparatus 1 according to this embodiment is configured as described above. Next, the treatment of forming a film of a release agent performed in the template treatment apparatus 1 will be described. FIG. 14 illustrates a main treatment flow of the release agent treatment, and FIG. 15 illustrates the states of the template T in respective steps.

First of all, a template T is taken by the template carrying body 12 out of the template cassette $C_T$ on the cassette mounting table 10 and carried to the transition unit 21 in the treatment station 3 (Step A1 in FIG. 14). In this event, the template T is housed in the template cassette $C_T$ such that its front surface $T_1$ having the transfer pattern C formed thereon faces upward, so that the template T in this state is carried to the transition unit 21.

The template T is then carried by the carry unit 20 to the cleaning unit 40 and suction-held by the chuck 151. Subsequently, the template T is irradiated with the ultraviolet light from the ultraviolet irradiation part 154 while the template T is being moved along the rail 153 by the chuck drive part 152. In this manner, the ultraviolet light is applied to the entire front surface $T_1$ of the template T to clean the front surface $T_1$ of the template T as illustrated in FIG. 15(*a*) (Step A2 in FIG. 14).

The template T is then carried by the carry unit 20 to the coating unit 30 and passed to the holding member 111. Subsequently, the release agent nozzle 132 is moved to a position above the central portion of the template T and the template T is rotated. Then, the release agent S is supplied onto the rotating template T and the release agent S is diffused over the template T by the centrifugal force, whereby the release agent S is applied on the entire front surface $T_1$ of the template T as illustrated in FIG. 15(*b*) (Step A3 in FIG. 14).

The template T is then carried by the carry unit 20 to the heating unit 43. The template T carried into the heating unit 43 is passed to the raising and lowering pins 162 and mounted on the mounting table 161. Subsequently, the lid body 170 is closed and the template T is heated by the heating plate 165 to, for example, 200° C. After a lapse of a predetermined period, the release agent S on the template T is baked as illustrated in FIG. 15(*c*) (Step A4 in FIG. 14).

Thereafter, the template T is carried by the carry unit 20 to the temperature regulation unit 41 and regulated to the predetermined temperature.

Thereafter, the template T is carried by the carry unit 20 to the rinse unit 31 and held by the holding part 142. Subsequently, the holding part 142 is lowered to immerse the template T in the organic solvent stored in the immersion bath 141. After a lapse of a predetermined period, only an unreacted portion of the release agent S peels off, whereby a film of the release agent S along the transfer pattern C is formed on the template T as illustrated in FIG. 15(*d*) (Step A5 in FIG. 14). Thereafter, the holding part 142 is moved up and the gaseous gas is sprayed from the gas supply part 145 to the template T to dry the front surface $T_1$ thereof. Note that the unreacted portion of the release agent means a portion other than the portion of the release agent chemically reacting with the front surface of the template to adsorb onto the front surface.

The template T is then carried by the carry unit 20 to the transition unit 21 and returned by the template carrying body 12 to the template cassette $C_T$ (Step A6 in FIG. 14). In this manner, a series of release agent treatment in the template treatment apparatus 1 is completed, whereby a film of the release agent S along the shape of the transfer pattern C is formed on the front surface $T_1$ of the template T.

According to the above embodiment, the template carry-in/out station 2 can keep a plurality of templates T, so that the templates T can be successively carried from the template carry-in/out station 2 to the treatment station 3. Further, in the treatment station 3, the carry unit 20 can carry the templates T to the various treatment units, so that predetermined treatments can be successively performed on a plurality of templates T. Therefore, it is possible to successively form films of the release agent S on the plurality of templates T.

Here, the template T has a thickness of, for example, 6.35 mm. In the case where the heating plate 165 is disposed above the template T (on the transfer pattern C side of the template T) in the heating unit 43, 44, 53, 54 of this embodiment, the heating plate 165 can directly heat the release agent S on the front surface $T_1$ of the template T from the front surface $T_1$ side. Accordingly, it is possible to efficiently heat and bake the release agent S irrespective of the thickness of the template T. On the other hand, even when the heating plate 165 is disposed below the template T, the heating plate 165 can efficiently heat the release agent S from the rear surface $T_2$ side of the template T by heat conduction.

Though the release agent S is applied on the front surface $T_1$ of the template T by supplying the release agent S onto the rotating template T in the coating unit 30, 32 of the treatment station 3 in the above embodiment, the release agent S may be applied onto the template T using, for example, a release agent nozzle extending in the width direction of the template T and having a supply port in a slit shape formed in the lower surface. In this case, the release agent S is supplied from the supply port while the release agent nozzle is being moved in the direction of the side of the template T, whereby the release agent S is applied on the entire front surface $T_1$ of the template T. Note that in this case, the release agent nozzle may be fixed and the template T may be moved. Further, the release agent S may be applied on the template T, for example, by immersing the template T in the immersion bath storing the release agent S.

Though the release agent S is rinsed away by immersing the template T in the organic solvent stored in the immersion bath 141 in the rinse unit 31, 33 in the above embodiment, a rinse unit having a configuration similar to that of the coating unit 30, 32 illustrated in FIG. 7 and FIG. 9 may be used. In this case, a rinse solution nozzle supplying an organic solvent as a rinse solution for the release agent S onto the template T is used in place of the release agent nozzle 132 of the coating unit 30, 32.

In this rinse unit, the organic solvent is supplied onto the rotating template T to rinse the entire front surface $T_1$ of the template T. After a lapse of a predetermined time, only the unreacted portion of the release agent S peels off, whereby a film of the release agent S along the transfer pattern C is formed on the template T. Then, after the supply of the organic solvent is stopped, the template T is further continuously rotated to spin-dry the front surface $T_1$. In this manner, the release agent S on the template T is rinsed away.

Though while the template T is being moved, the moving template T is irradiated with ultraviolet light in the cleaning unit 40, 50 in the above embodiment, an ultraviolet irradiation part covering the entire front surface $T_1$ of the template T may be used to irradiate the template T with the ultraviolet light. The ultraviolet irradiation part is disposed above the template T in a manner to face the template T. In this case, it is possible to apply the ultraviolet light to the entire front surface $T_1$ of the template T by one time irradiation and thus rapidly clean the front surface $T_1$ of the template T. Further, in this case, it is also adoptable to rotate the template T and irradiate the entire front surface $T_1$ of the rotating template T with ultraviolet light as in the coating unit 30, 32 illustrated in FIG. 7 and FIG. 9.

Figure 16:
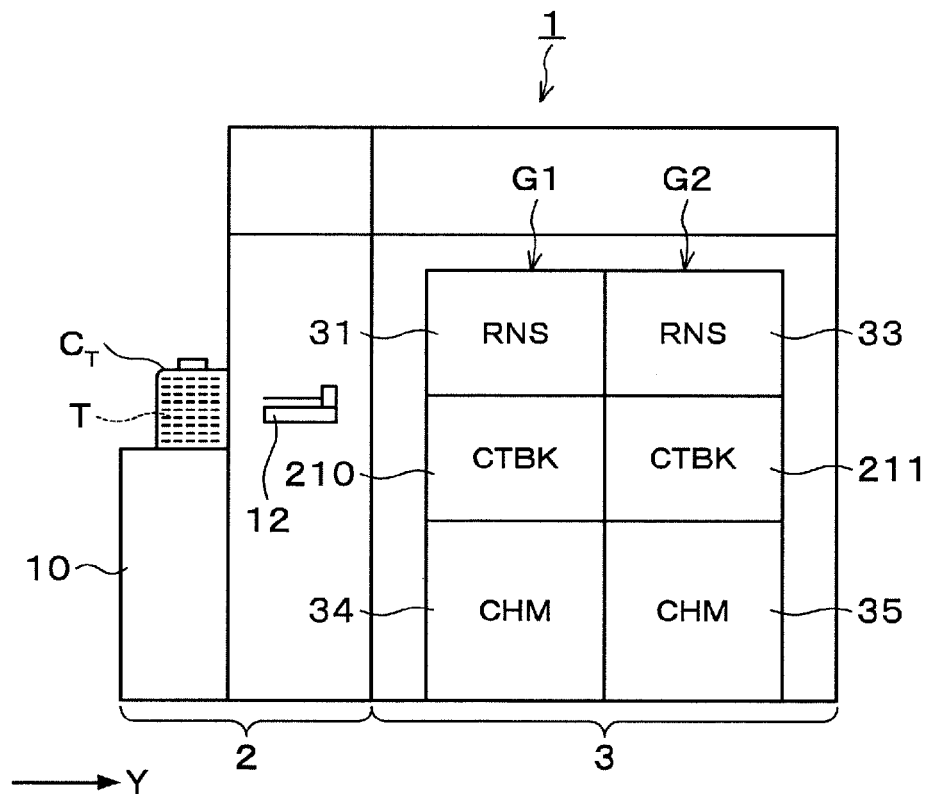
FIG. 16 A side view illustrating the outline of the configuration of a template treatment apparatus according to another embodiment.

The application of the release agent S onto the template T and the heating of the template T are performed respectively in the separate treatment units (the coating unit 30, 32 and the heating unit 43, 44, 53, 54) in the above embodiment but may be performed in one treatment unit. In this case, a coating and heating unit 210 is arranged in the first treatment block G1 of the template treatment apparatus 1 as illustrated in FIG. 16 in place of the coating unit 30 illustrated in FIG. 2. Similarly, a coating and heating unit 211 is arranged also in the second treatment block G2 in place of the coating unit 32. Further, the heating units 43, 44, 53, 54 illustrated in FIG. 3 are omitted in this case.

Figure 17:
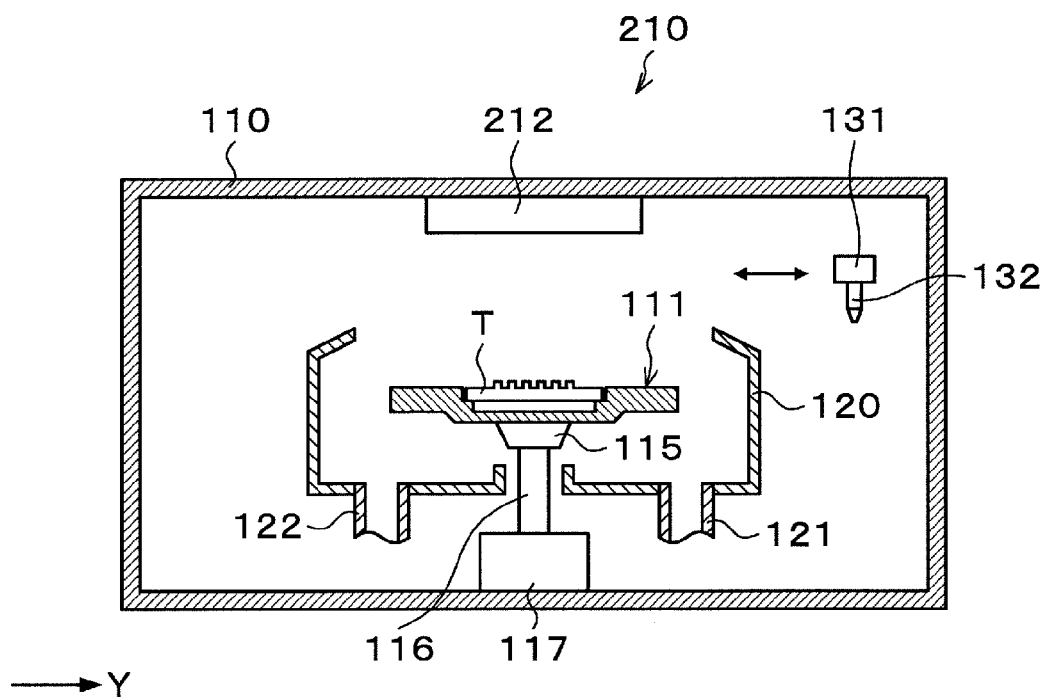
FIG. 17 A longitudinal sectional view illustrating the outline of the configuration of a coating and heating unit.

As illustrated in FIG. 17, the coating and heating unit 210 has a heat supply device 212 in addition to a configuration similar to that of the coating unit 30 illustrated in FIG. 7 and FIG. 9. The heat supply device 212 can spray gaseous gas such heated dry air downward. Further, the heat supply device 212 is disposed above the template T to face the template T held by the holding member 111. Note that the coating and heating unit 211 also has the similar configuration.

In this case, it is possible to apply the release agent S to the entire front surface $T_1$ of the template T by the release agent nozzle 132 and then spray the heated gaseous gas from the heat supply device 212 to the template T to thereby heat the template T. The application of the release agent S and the heating of the template T can be sequentially performed in the one coating and heating unit 210 as described above, so that it is possible to more smoothly form a film of the release agent S on the template T in the treatment station 3 to improve the throughput of the release agent treatment. Further, the configuration of the template treatment apparatus 1 can be simplified.

Figure 18:
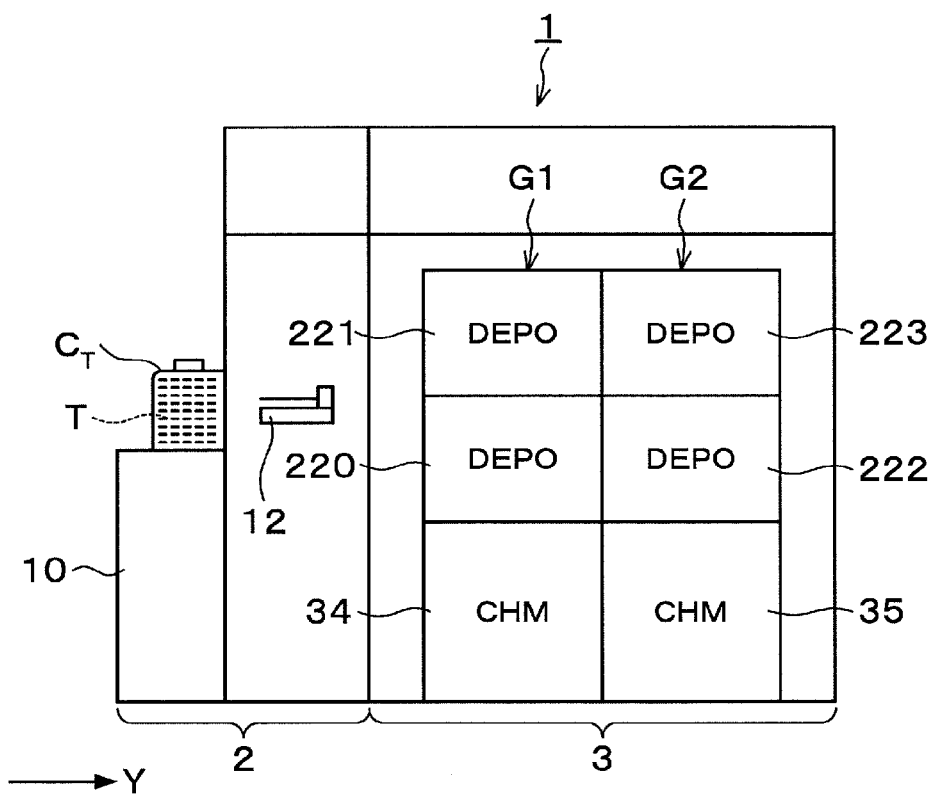
FIG. 18 A side view illustrating the outline of the configuration of the template treatment apparatus according to another embodiment.

Though the release agent S is applied to the front surface $T_1$ of the template T by supplying the liquid release agent S onto the rotating template T in the coating unit 30, 32 in the above embodiment, a film of the release agent S may be formed by depositing a vaporized release agent on the front surface $T_1$ of the template T. In this case, coating units 220, 221 are arranged in the first treatment block G1 of the template treatment apparatus 1 as illustrated in FIG. 18 in place of the coating unit 30 and the rinse unit 31 illustrated in FIG. 2. Similarly, coating units 222, 223 are arranged also in the second treatment block G2 in place of the coating unit 32 and the rinse unit 33.

Figure 19:
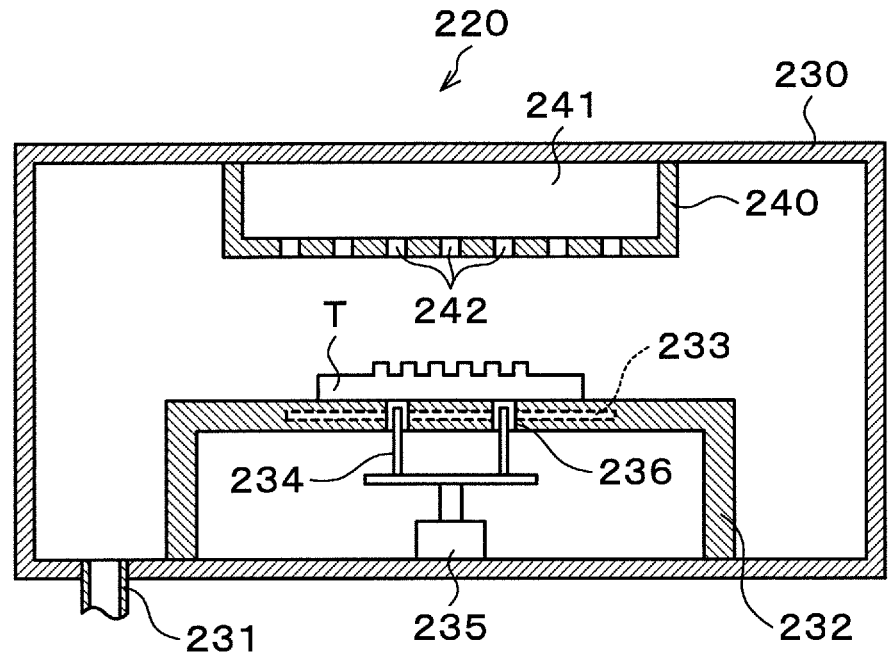
FIG. 19 A transverse sectional view illustrating the outline of the configuration of a coating unit according to another embodiment.

The coating unit 220 has a casing 230 having a carry-in/out port (not illustrated) for the template T formed in its side surface as illustrated in FIG. 19. To the bottom surface of the casing 230, an exhaust pipe 231 exhausting the atmosphere in the casing 230 is connected.

On the bottom surface in the casing 230, a mounting table 232 on which the template T is mounted is provided. The template T is mounted on the upper surface of the mounting table 232 such that its front surface $T_1$ faces upward. Inside the upper surface of the mounting table 232, a temperature control plate 233 as a temperature control part controlling the temperature of the template T is provided. The temperature control plate 233 has, for example, a Peltier element built therein and can set the template T to a predetermined temperature. In the mounting table 232, raising and lowering pins 234 for supporting the template T from below and raising and lowering the template T are provided. The raising and lowering pins 234 can move up and down by means of a raising and lowering drive part 235. In the upper surface of the mounting table 232, through holes 236 penetrating the upper surface in the thickness direction are formed so that the raising and lowering pins 234 are inserted into the through holes 236.

On the ceiling surface in the casing 230 and above the mounting table 232, a shower head 240 as a release agent supply part supplying the vaporized release agent downward onto the template T is provided. The shower head 240 is disposed to face the front surface $T_1$ of the template T mounted on the mounting table 232. Inside the shower head 240, an inner space 241 into which the vaporized release agent supplied from a release agent supply source (not illustrated) is introduced is formed. At the lower surface of the shower head 240, a plurality of supply ports 242 supplying downward the release agent introduced into the inner space 241 are provided, distributed over the entire lower surface of the shower head 240. In short, the plurality of supply ports 242 are formed so that the vaporized release agent is supplied uniform within the horizontal surface from the shower head 240 to the front surface $T_1$ of the template T. The release agent supplied from the shower head 240 is deposited on the front surface $T_1$ of the template T along the transfer pattern C.

Note that the configurations of the coating units 221, 222, 223 are the same as that of the above-described coating unit 220, and therefore the description thereof will be omitted.

Next, a treatment of forming a film of the release agent S on the template T in the treatment station 3 in which the coating units 220, 221, 222, 223 are arranged will be described.

Figure 20:
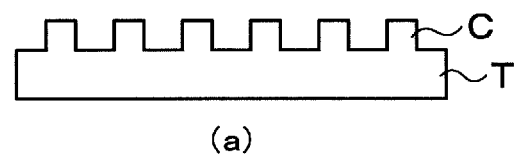
FIG. 20 An explanatory view schematically illustrating the states of a template in respective steps of the release agent treatment, FIG. 20(a) illustrating the appearance that the front surface of the template is cleaned, FIG. 20(b) illustrating the appearance that a vaporized release agent is deposited on the front surface of the template, and FIG. 20(c) illustrating the appearance that the release agent on the template is baked.
Figure 20:
Figure 20:
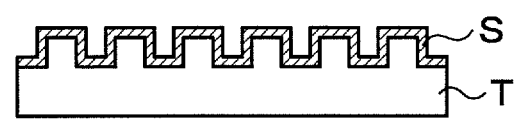

In the treatment station 3, the template T is first carried to the cleaning unit 40, in which the front surface $T_1$ of the template T is cleaned as illustrated in FIG. 20(a). Thereafter, the template T is carried to the coating unit 220, in which a vaporized release agent $S_0$ is supplied onto the front surface $T_1$ of the template T as illustrated in FIG. 20(b) and the release agent $S_0$ is deposited along the transfer pattern C. In this event, the template T is set to a predetermined temperature by the temperature control plate 233. Thereafter, the template T is carried into the heating unit 43, in which the release agent S on the template T is baked as illustrate in FIG. 20(c). The template T is then carried to the temperature regulation unit 41, in which the template T is regulated to a predetermined temperature. In this manner, a film of the release agent S along the transfer pattern C is formed on the front surface $T_1$ of the template T.

According to the above embodiment, since the vaporized release agent $S_0$ is deposited along the transfer pattern C of the template T, it is unnecessary to rinse the release agent S away. Accordingly, it is possible to more smoothly form a film of the release agent S on the template T in the treatment station 3 and thereby improve the throughput of the release agent treatment.

Further, since the vaporized release agent $S_0$ is supplied onto the template T set to the predetermined temperature by the temperature control plate 233, it is possible to efficiently deposit the release agent $S_0$ on the template T.

Furthermore, since the vaporized release agent $S_0$ is supplied from the plurality of supply ports 242 of the shower head 240 without requiring a complex drive mechanism, the configuration of the coating unit 220 can be simplified.

Note that though the vaporized release agent $S_0$ is supplied from the plurality of supply ports 242 of the shower head 240 in the coating unit 220, 221, 222, 223 in the above embodiment, the vaporized release agent $S_0$ may be supplied onto the template T using, for example, a release agent nozzle extending in the width direction of the template T and having a supply port in a slit shape formed in the lower surface. In this case, the vaporized release agent $S_0$ is supplied from the supply port while the release agent nozzle is being moved in the direction of the side of the template T, whereby the release agent S is applied on the entire front surface $T_1$ of the template T.

Figure 21:
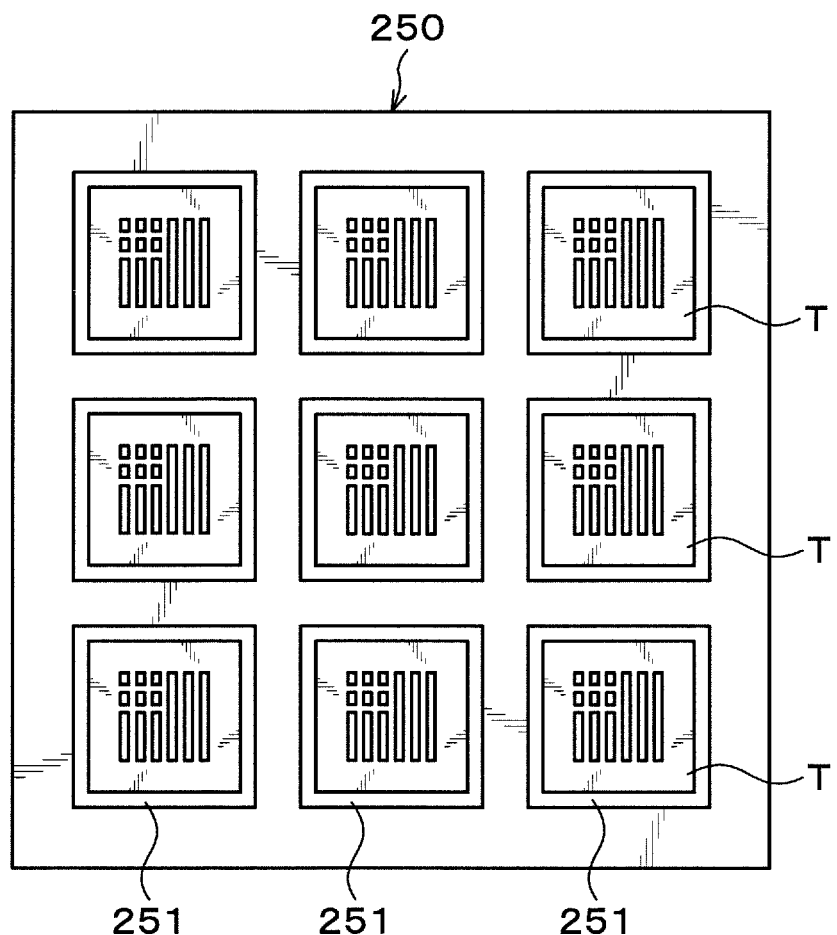
FIG. 21 A plan view of a holder.
Figure 22:
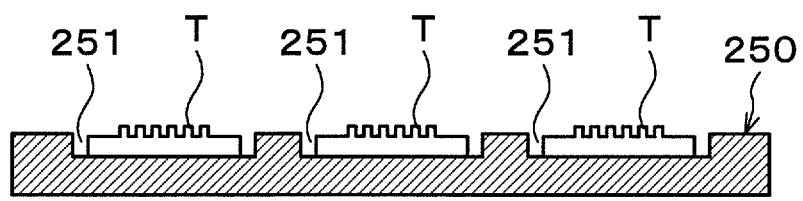
FIG. 22 A longitudinal sectional view of the holder.

Though the template T is individually carried and treated in the template treatment apparatus 1 in the above embodiment, a plurality of, for example, nine templates T may be held by one holder 250 and treated as illustrated in FIG. 21. In this case, accommodating parts 251 recessed downward for accommodating the templates T are formed in the holder 250 as illustrated in FIG. 22. At the bottom surfaces of the accommodating parts 251, for example, a plurality of suction ports (not illustrated) are formed to suction-hold the templates T in the accommodating parts 251.

According to this embodiment, it is possible to perform predetermined treatments on the plurality of templates T at a time in the treatment station 3. Therefore, it is possible to form films of the release agent S on more templates T in a short time and thereby improve the throughput of the release agent treatment.

Figure 23:
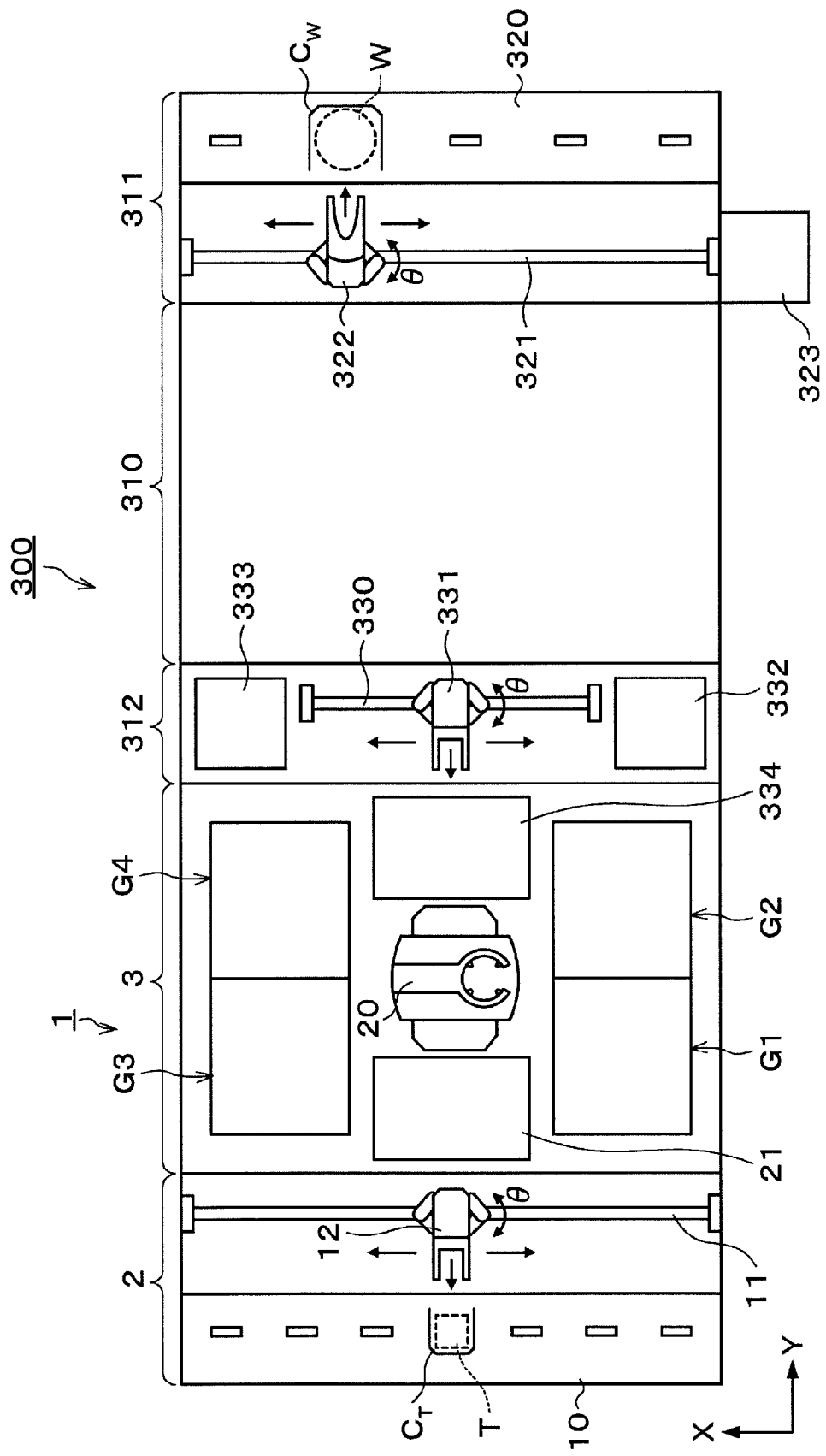
FIG. 23 A plan view illustrating the outline of the configuration of an imprint system according to this embodiment.

The template treatment apparatus 1 in the above embodiment may be disposed in an imprint system 300 as illustrated in FIG. 23. The imprint system 300 includes an imprint unit 310 for forming a resist pattern on a wafer W as a substrate using the template T, and a wafer carry-in/out station 311 as a substrate carry-in/out station for carrying a plurality of, for example, 25 wafers W per cassette as a unit from/to the outside into/from the imprint system 300 and carrying the wafers W into/out of a wafer cassette $C_W$. Further, an interface station 312 is arranged between the template treatment apparatus 1 and the imprint unit 310. The imprint system 300 has a configuration in which the template treatment apparatus 1, the interface station 312, the imprint unit 310, and the wafer carry-in/out station 311 are integrally connected.

In the wafer carry-in/out station 311, a cassette mounting table 320 is provided. The cassette mounting table 320 is configured such that a plurality of wafer cassettes $C_W$ can be mounted thereon in a line in an X-direction (a top and bottom direction in FIG. 23). In other words, the wafer carry-in/out station 311 is configured to be capable of keeping a plurality of wafers W therein.

In the wafer carry-in/out station 311, a wafer carrying body 322 is provided which is movable on a carry path 321 extending in the X-direction. The wafer carrying body 322 is also movable in a vertical direction and around the vertical (in a θ-direction), and thus can carry the wafer W between the wafer cassette $C_W$ and the imprint unit 310.

In the wafer carry-in/out station 311, an alignment unit 323 adjusting the orientation of the wafer W is further provided. In the alignment unit 323, the orientation of the wafer W is adjusted based on, for example, the position of a notch portion of the wafer W.

In the interface station 312, a template carrying body 331 is provided which moves on a carry path 330 extending in the X-direction. Further, a reversing unit 332 reversing the front and rear surfaces of the template T is placed on the X-direction positive direction side of the carry path 330, and a buffer cassette 333 temporarily storing a plurality of templates T is placed on the X-direction negative direction side of the carry path 330. The template carrying body 331 is also movable in the vertical direction and around the vertical (in the θ-direction), and thus can carry the template T between the treatment station 3, the reversing unit 332, the buffer cassette 333, and the imprint unit 310.

In the treatment station 3 of the template treatment apparatus 1, a transition unit 334 for passing the template T is placed on the interface station 312 side of the carry unit 20.

Figure 24:
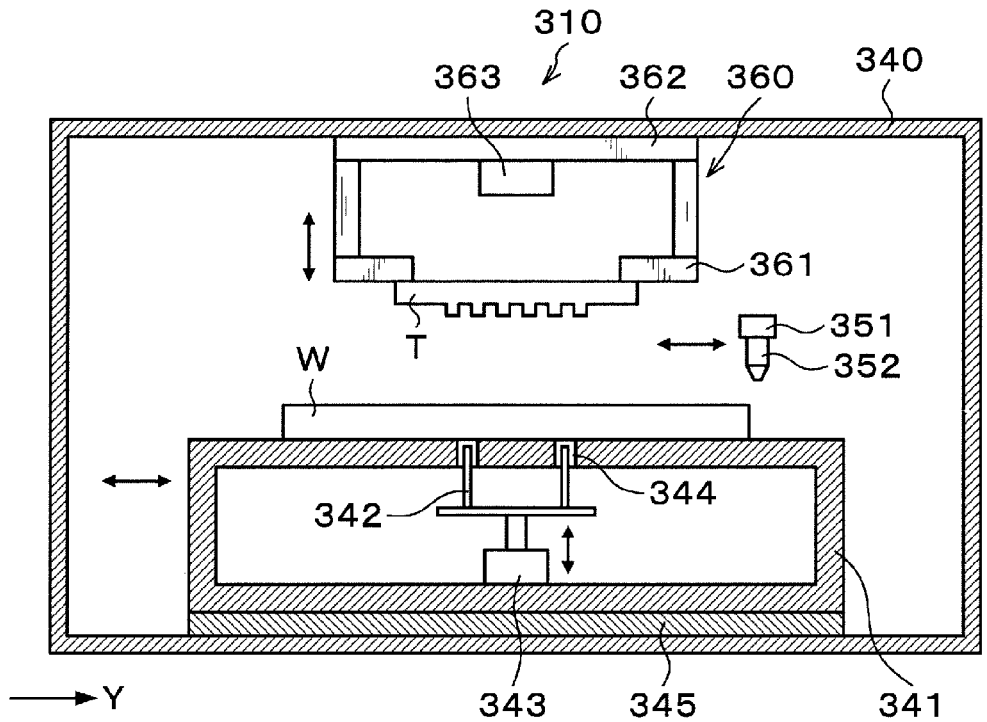
FIG. 24 A longitudinal sectional view illustrating the outline of the configuration of an imprint unit.

Next, the configuration of the aforementioned imprint unit 310 will be described. The imprint unit 310 has a casing 340 having a carry-in/out port (not illustrated) for the template T and a carry-in/out port (not illustrated) for the wafer W which are formed in its side surfaces as illustrated in FIG. 24.

On the bottom surface in the casing 340, a wafer holding part 341 on which the wafer W is mounted and held is provided. The wafer W is mounted on the upper surface of the wafer holding part 341 such that its surface to be processed faces upward. Inside the wafer holding part 341, raising and lowering pins 342 for supporting the wafer W from below and raising and lowering the wafer W are provided. The raising and lowering pins 342 can move up and down by means of a raising and lowering drive part 343. In the upper surface of the wafer holding part 341, through holes 344 penetrating the upper surface in the thickness direction are formed so that the raising and lowering pins 342 are inserted into the through holes 344. Further, the wafer holding part 341 is movable in the horizontal direction and rotatable around the vertical by means of a moving mechanism 345 provided below the wafer holding part 341.

Figure 25:
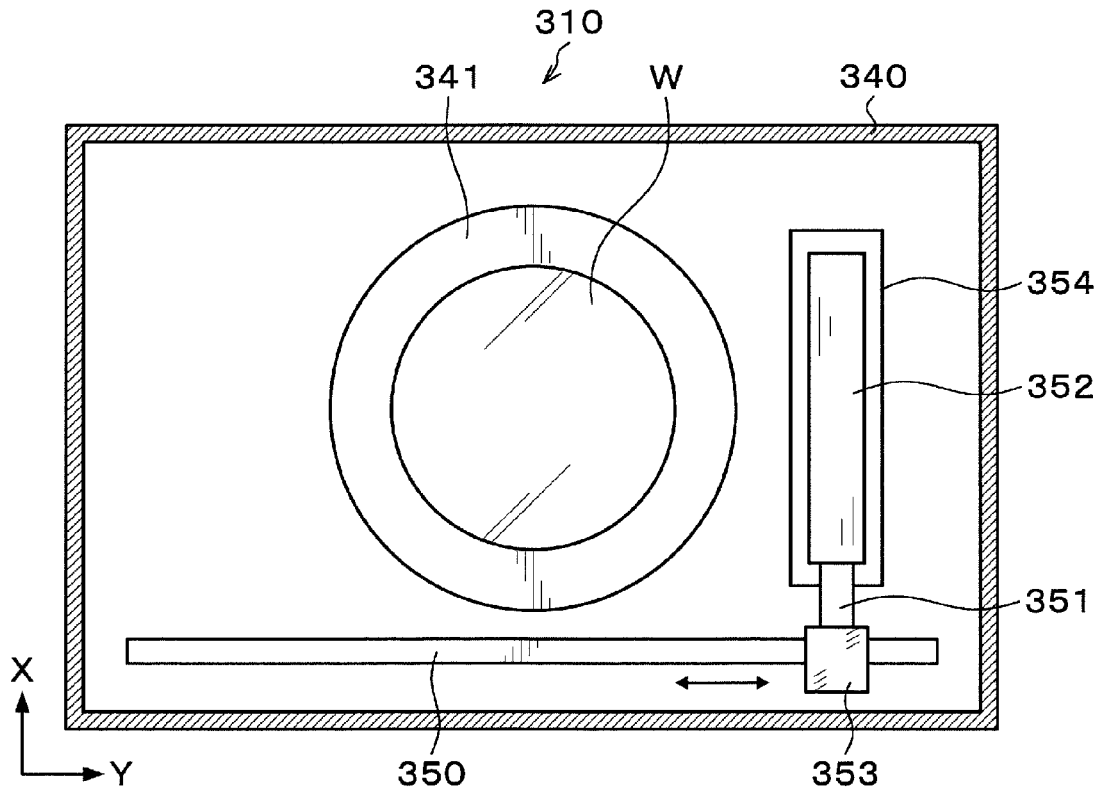
FIG. 25 A transverse sectional view illustrating the outline of the configuration of the imprint unit.

As illustrated in FIG. 25, on an X-direction negative direction (a downward direction in FIG. 25) side of the wafer holding part 341, a rail 350 extending along a Y-direction (a right and left direction in FIG. 25) is provided. The rail 350 is formed, for example, from a Y-direction negative direction (a left direction in FIG. 25) side outer position of the wafer holding part 341 to a Y-direction positive direction (a right direction in FIG. 25) side outer position. On the rail 350, for example, an arm 351 is attached.

On the arm 351, a resist solution nozzle 352 supplying the resist solution onto the wafer W is supported. The resist solution nozzle 352 has an elongated shape along the X-direction having the size, for example, equal to or longer than the dimension of the diameter of the wafer W. For the resist solution nozzle 352, for example, an ink-jet type nozzle is used, and a plurality of supply ports (not illustrated) formed in a line along the longitudinal direction are formed at a lower portion of the resist solution nozzle 352. The resist solution nozzle 352 can precisely control the supply timing of the resist solution, the supply amount of the resist solution and so on.

The arm 351 is movable on the rail 350 by means of a nozzle drive part 353. Thus, the resist solution nozzle 352 can move from a waiting section 354 provided at a Y-direction positive direction side outer position of the wafer holding part 341 to a position above the wafer W on the wafer holding part 341 and further move in the radial direction of the wafer W above the front surface of the wafer W. Further, the arm 351 is movable up and down by means of the nozzle drive part 353 to be able to adjust the height of the resist solution nozzle 352.

On the ceiling surface in the casing 340 and above the wafer holding part 341, a template holding part 360 holding the template T is provided as illustrated in FIG. 24. More specifically, the wafer holding part 341 and the template holding part 360 are arranged such that the wafer W mounted on the wafer holding part 341 faces the template T held by the template holding part 360. Further, the template holding part 360 has a chuck 361 suction-holding the outer peripheral portion of the rear surface $T_2$ of the template T. The chuck 361 is movable in the vertical direction and rotatable around the vertical by means of a moving mechanism 362 provided above the chuck 361. Thus, the template T can rotate and move up and down in a predetermined orientation with respect to the wafer W on the wafer holding part 341.

The template holding part 360 has a light source 363 provided above the template T held by the chuck 361. From the light source 363, light such as visible light, near ultraviolet light, ultraviolet light is emitted, and the light from the light source 363 is transmitted through the template T and applied downward.

Figure 26:
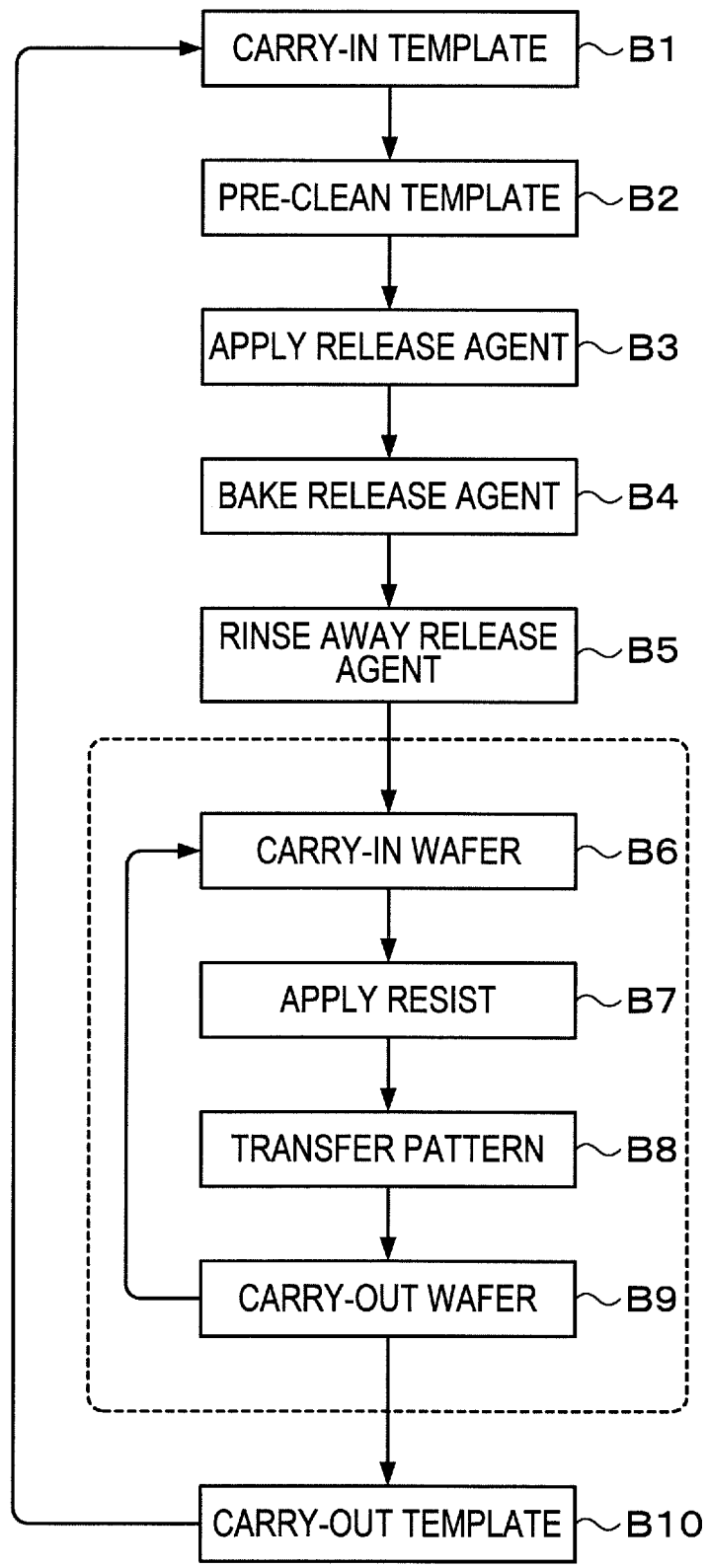
FIG. 26 A flowchart illustrating steps of imprint processing.
Figure 27:
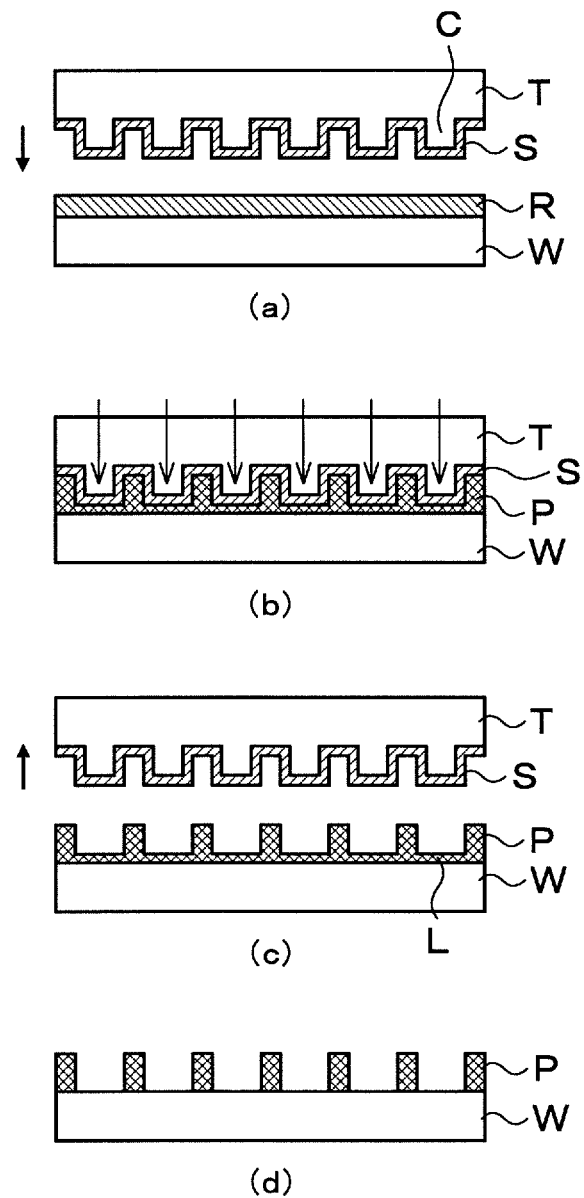
FIG. 27 An explanatory view schematically illustrating the states of a template and a wafer in respective steps of the imprint processing, FIG. 27(a) illustrating the appearance that a resist solution is applied on the wafer, FIG. 27(b) illustrating the appearance that photo polymerization of a resist film on the wafer takes place, FIG. 27(c) illustrating the appearance that a resist pattern is formed on the wafer, and FIG. 27(d) illustrating the appearance that a residual film on the wafer is removed.

The imprint system 300 according to this embodiment is configured as described above. Next, the imprint processing performed in the imprint system 300 will be described. FIG. 26 illustrates a main processing flow of the imprint processing, and FIG. 27 illustrates the states of the template T and the wafer W in respective steps of the imprint processing.

First of all, a template T is carried by the template carrying body 12 from the template carry-in/out station 2 to the treatment station 3 (Step B1 in FIG. 26). In the treatment station 3, cleaning of the front surface $T_1$ of the template T (Step B2 in FIG. 26), application of the release agent S to the front surface $T_1$ (Step B3 in FIG. 26), baking of the release agent S (Step B4 in FIG. 26), and rinsing away of the release agent S (Step B5 in FIG. 26) are sequentially performed to form a film of the release agent S on the front surface $T_1$ of the template T. Note that the Steps B2 to B5 are the same as the Steps A2 to A5 in the above-described embodiment, and therefore the detailed description thereof will be omitted.

The template T on which a film of the release agent S has been formed is carried to the transition unit 334. The template T is subsequently carried by the template carrying body 331 in the interface station 312 to the reversing unit 332 and the front and rear surfaces of the template T are reversed. In short, the rear surface $T_2$ of the template T is made to face upward. Thereafter, the template T is carried by the template carrying body 331 to the imprint unit 310 and suction-held by the chuck 361 of the template holding part 360.

During the time when the release agent treatment is performed on the template T in the treatment station 3 in this manner and the template T is carried to the imprint unit 310, a wafer W is taken by the wafer carrying body 322 out of the wafer cassette $C_W$ on the cassette mounting table 320 and carried to the alignment unit 323 in the wafer carry-in/out station 311. Then, in the alignment unit 323, the orientation of the wafer W is adjusted based on the position of the notch portion of the wafer W. Thereafter, the wafer W is carried by the wafer carrying body 322 to the imprint unit 310 (Step B6 in FIG. 26). Note that in the wafer carry-in/out station 311, the wafer W in the wafer cassette $C_W$ is housed such that its surface to be processed faces upward, so that the wafer W in this state is carried to the imprint unit 310.

The wafer W carried into the imprint unit 310 is passed to the raising and lowering pins 342 and mounted and held on the wafer holding part 341. Subsequently, the wafer W held on the wafer holding part 341 is moved to a predetermined position in the horizontal direction to be aligned, and thereafter the resist solution nozzle 352 is moved in the radial direction of the wafer W and applies the resist solution onto the wafer W as illustrated in FIG. 27(a), whereby a resist film R as a coating film is formed (Step B7 in FIG. 26). In this event, the control unit 200 controls the supply timing, the supply amount and so on of the resist solution supplied from the resist solution nozzle 352. More specifically, the resist solution is applied such that the amount of the resist solution to be applied to a portion corresponding to a protruding portion in the resist pattern to be formed on the wafer W (a portion corresponding to a recessed portion in the transfer pattern C of the template T) is large, while the amount of the resist solution to be applied to a portion corresponding to a recessed portion in the resist pattern (a portion corresponding to a protruding portion in the transfer pattern C) is small. The resist solution is applied onto the wafer W according to the aperture ratio of the transfer pattern C in this manner.

Upon formation of the resist film R on the wafer W, the wafer W held on the wafer holding part 341 is moved to a predetermined position in the horizontal direction to be aligned, and the template T held by the template holding part 360 is rotated in a predetermined orientation. The template T is then moved down toward the wafer W as illustrated by an arrow in FIG. 27($a$). The template T is moved down to a predetermined position, and the front surface $T_1$ of the template T is pressed against the resist film R on the wafer W. Note that the predetermined position is set based on the height of the resist pattern to be formed on the wafer W. Subsequently, light is applied from the light source 363. The light from the light source 363 is transmitted through the template T and applied to the resist film R on the wafer W as illustrated in FIG. 27($b$), whereby photo polymerization of the resist film R takes place. In this manner, the transfer pattern C of the template T is transferred to the resist film R on the wafer W, whereby a resist pattern P is formed (Step B8 in FIG. 26).

Thereafter, the template T is moved up as illustrated in FIG. 27($c$), whereby the resist pattern P is formed on the wafer W. In this event, since the release agent S has been applied on the front surface $T_1$ of the template T, the resist on the wafer W never adheres to the front surface $T_1$ of the template T. Thereafter, the wafer W is passed to the wafer carrying body 322 by the raising and lowering pins 342, and carried from the imprint unit 310 to the wafer carry-in/out station 311 and returned to the wafer cassette $C_W$ (Step B9 in FIG. 26). Note that a thin residual film L of resist can remain in the recessed portion of the resist pattern P formed on the wafer W, and the residual film L may be removed as illustrated in FIG. 27($d$), for example, outside the imprint system 300.

By repeatedly performing the above-described Steps B6 to B9 (a part surrounded by a dotted line in FIG. 26), resist patterns P are formed respectively on a plurality of wafers W using one template T. During this time, the above-described Steps B1 to B5 are repeatedly performed to form films of the release agent S on the front surfaces $T_1$ of a plurality of templates T. The templates T on which the films of the release agent S have been formed are stored in the buffer cassette 333 in the interface station 312.

Then, after Steps B6 to B9 are performed on a predetermined number of wafers W, the used template T is carried by the wafer carrying body 331 out of the imprint unit 310 and carried to the reversing unit 332 (Step B10 in FIG. 26). Subsequently, a template T in the buffer cassette 333 is carried by the wafer carrying body 331 into the imprint unit 310. Thus, the template T in the imprint unit 310 is replaced. Note that the timing to replace the template T is set in consideration of the deterioration and the like of the template T. Further, also when a different pattern P is formed on the wafer W, the template T is replaced. The template T may be replaced, for example, every time the template T is used once. Alternatively, the template T may be replaced for every wafer W, or the template T may be replaced for every lot.

The front and rear surfaces of the used template T carried to the reversing unit 332 are reversed. The template T is then returned to the template cassette $C_T$ by the wafer carrying body 331, the carry unit 20, and the wafer carrying body 12. In this manner, predetermined resist patterns P are successively formed on a plurality of wafers W while the template is successively replaced in the imprint system 300.

Since the imprint system 300 in the above embodiment has the template treatment apparatus 1, it is possible to successively supply the templates T into the imprint unit 310 while forming films of the release agent S on the templates T in the imprint system 300. Thus, for example, before the template T deteriorates or even when different resist patterns P are formed on a plurality of wafers W, the template T in the imprint unit 310 can be successively and efficiently replaced. Accordingly, predetermined resist patterns P can be successively formed on a plurality of wafers W. This also enables realization of mass production of semiconductor devices.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention. The present invention is not limited to the embodiments but can take various forms. The present invention is also applicable to the case where the substrate is a substrate other than the wafer, such as an FPD (Flat Panel Display), a mask reticle for a photomask or the like.

INDUSTRIAL APPLICABILITY

The present invention is useful in forming a film of a release agent on a template having a transfer pattern formed on a front surface thereof and useful in forming a predetermined pattern on a substrate using the template.

EXPLANATION OF CODES 1 template treatment apparatus
2 template carry-in/out station
3 treatment station
20 carry unit
30, 32 coating unit
31, 33 rinse unit
40, 50 cleaning unit
43, 44, 53, 54 heating unit
132 release agent nozzle
165 heating plate
200 control unit
210, 211 coating and heating unit
220 to 223 coating unit
233 temperature control plate
240 shower head
242 supply port
250 holder
300 imprint system
310 imprint unit
311 wafer carry-in/out station
312 interface station
C transfer pattern
G1 to G4 treatment block
P resist pattern
R resist film
S release agent
T template
W wafer

What is claimed is:

1. An imprint system, comprising:
a treatment station configured to perform a predetermined treatment on a template having a transfer pattern formed on a front surface of the template, to form a release agent film on the front surface of the template;
a template carry-in/out station separate from the treatment station and configured to keep a plurality of the templates, and configured to carry the template into/out of said treatment station;
an imprint unit configured to transfer the transfer pattern to a coating film formed on the substrate using the template having the film of the release agent formed on the front surface of the template in the treatment station, to form a predetermined pattern in the coating film;
an interface station separate from the template carry-in/out station, a carry unit, and a substrate carry-in/out station, and configured to pass the template between the treatment station and the imprint unit; and
the substrate carry-in/out station capable of keeping a plurality of the substrates, and carrying the substrate into/out of the imprint unit,
wherein said treatment station comprises:
  a cleaning unit configured to clean the front surface of the template;
  a coating unit configured to apply a release agent to the cleaned front surface of the template;
  a heating unit configured to bake the applied release agent; and
  the carry unit separate from the template carry-in/out station, and configured to carry the template to and from said cleaning unit, said coating unit, and said heating unit,
wherein the treatment station, the template carry-in/out station, the imprint unit, and the interface station are arranged adjacently, and are aligned in a straight line, and
wherein the substrate carry-in/out station is arranged next to the imprint unit.

2. The imprint system as set forth in claim 1,
wherein said heating unit comprises a heating part heating the template, and
wherein said heating part is disposed on the transfer pattern side of the template.

3. The imprint system as set forth in claim 1,
wherein said coating unit comprises a release agent supply part supplying a liquid release agent to the front surface of the template,
wherein said treatment station comprises a rinse unit rinsing the release agent baked in said heating unit away to remove an unreacted portion of the release agent, and
wherein said carry unit carries the template also to said rinse unit.

4. The imprint system as set forth in claim 3, comprising:
a coating and heating unit applying a release agent to the front surface of the template and baking the applied release agent, in place of said coating unit and said heating unit.

5. The imprint system as set forth in claim 1,
wherein said coating unit comprises a release agent supply part supplying a gaseous release agent to the front surface of the template.

6. The imprint system as set forth in claim 5,
wherein said release agent supply part is disposed to face the front surface of the template, and
wherein said release agent supply part has a plurality of supply ports formed in a lower surface thereof for uniformly supplying the gaseous release agent to the front surface of the template.

7. The imprint system as set forth in claim 5,
wherein said coating unit comprises a temperature control part controlling a temperature of the template.

8. The imprint system as set forth in claim 1,
wherein said plurality of templates are held by one holder.

9. The imprint system as set forth in claim 1, wherein
the treatment station further comprises a first transition unit configured to hold the template,
the template carry-in/out unit is configured to only carry the template into/out of the first transition unit in the treatment station,
the carry unit is configured to carry the template to/from the first transition unit, the cleaning unit, the coating unit, and the heating unit, and
the carry unit cannot access the plurality of the templates kept in the template carry-in/out unit.

10. The imprint system as set forth in claim 1, wherein
the treatment station further comprises a second transition unit configured to hold the template,
the interface station is configured to pass the template between the second transition unit in the treatment station and the imprint unit,
the carry unit is configured to carry the template to/from the first transition unit, the second transition unit, the cleaning unit, the coating unit, and the heating unit, and
the carry unit cannot pass the template between the treatment station and the imprint unit.

11. An imprint system, comprising:
a treatment station configured to perform a predetermined treatment on a selected template having a transfer pattern formed on a front surface of the template, to form a release agent film on the front surface of the selected template, the treatment station including
  a cleaning unit configured to clean the front surface of the selected template;
  a coating unit configured to apply the release agent to the cleaned front surface of the selected template;
  a heating unit configured to bake the applied release agent; and
  a carry unit configured to carry the selected template to/from the cleaning unit, the coating unit, and the heating unit;
a template carry-in/out station separate from the carry unit, configured to keep a plurality of stored templates that includes the selected template, and configured to carry the selected template into/out of the treatment station;
an imprint unit configured to transfer the transfer pattern to a coating film formed on the substrate using the template having the film of the release agent formed on the front surface of the template in the treatment station, to form a predetermined pattern in the coating film;
an interface station separate from the template carry-in/out station, the carry unit, and a substrate carry-in/out station, and configured to pass the template between the treatment station and the imprint unit; and
the substrate carry-in/out station capable of keeping a plurality of the substrates, and carrying the substrate into/out of the imprint unit,
wherein the treatment station, the template carry-in/out station, the imprint unit, and the interface station are arranged adjacently, and are aligned in a straight line, and wherein the substrate carry-in/out station is arranged next to the imprint unit.

12. The imprint system as set forth in claim 11, wherein the treatment station further comprises a first transition unit configured to hold the selected template, the template carry-in/carry-out unit is configured to only carry the selected template into/out of the first transition unit in the treatment station, the carry unit is configured to carry the template to/from the first transition unit, the cleaning unit, the coating unit, and the heating unit, and the carry unit cannot access the plurality of stored templates kept in the template carry-in/carry-out unit.

13. The imprint system as set forth in claim 11, further comprising:

an imprint unit configured to transfer the transfer pattern to a coating film formed on the substrate using the selected template having the film of the release agent formed on the front surface of the template in the treatment station, to form a predetermined pattern in the coating film; and an interface station separate from the template carry-in/out station and the carry unit, and configured to pass the selected template between the template treatment apparatus and the imprint unit.

14. The imprint system as set forth in claim 13, wherein the treatment station further comprises a second transition unit configured to hold the selected template, the interface station is configured to pass the selected template between the second transition unit in the treatment station and the imprint unit, the carry unit is configured to carry the selected template to/from the first transition unit, the second transition unit, the cleaning unit, the coating unit, and the heating unit, and the carry unit cannot pass the selected template between the treatment station and the imprint unit.

* * * * *